(12) United States Patent
Lyn et al.

(10) Patent No.: US 11,616,517 B2
(45) Date of Patent: Mar. 28, 2023

(54) MULTIBAND TRANSMITTER

(71) Applicant: Qualcomm Incorporated, San Diego, CA (US)

(72) Inventors: Sean Joel Lyn, Cupertino, CA (US); Cheng-Han Wang, San Jose, CA (US); Hye Jin Song, Santa Clara, CA (US); Sang-Oh Lee, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 31 days.

(21) Appl. No.: 17/179,264

(22) Filed: Feb. 18, 2021

(65) Prior Publication Data

US 2021/0258023 A1 Aug. 19, 2021

Related U.S. Application Data

(60) Provisional application No. 62/978,729, filed on Feb. 19, 2020.

(51) Int. Cl.
*H04B 1/00* (2006.01)
*H04B 1/04* (2006.01)

(52) U.S. Cl.
CPC .............. *H04B 1/005* (2013.01); *H04B 1/04* (2013.01); *H04B 2001/0408* (2013.01); *H04B 2001/0491* (2013.01)

(58) Field of Classification Search
CPC .... H04B 1/005; H04B 1/0053; H04B 1/0057; H04B 1/006; H04B 1/0067; H04B 1/02;

(Continued)

(56) References Cited

U.S. PATENT DOCUMENTS 8,493,126 B2 * 7/2013 Sankaranarayanan ...................... H03D 7/1441
327/356
9,960,795 B1 * 5/2018 Liu .......................... H03F 3/245

(Continued)

FOREIGN PATENT DOCUMENTS

EP 1796203 A1 6/2007
EP 2587677 A1 5/2013

(Continued)

OTHER PUBLICATIONS

International Search Report and Written Opinion—PCT/US2021/018808—ISAEPO—dated Jul. 21, 2021 19 pages.

(Continued)

*Primary Examiner* — Young T. Tse
(74) *Attorney, Agent, or Firm* — Colby Nipper; Qualcomm Incorporated

(57) ABSTRACT

Apparatuses and methods are disclosed regarding a multi-band transmitter. In an example aspect, an apparatus for processing signals for wireless transmission includes a wireless interface device. The wireless interface device includes an upconverter, a tunable filter, and a driver amplifier. The upconverter has an output and is configured to upconvert a baseband frequency to a radio frequency based on a local oscillator signal. The tunable filter has an input and an output; the input of the tunable filter is coupled to the output of the upconverter. The driver amplifier has an input; the input of the driver amplifier is coupled to the output of the tunable filter.

30 Claims, 11 Drawing Sheets

(58) Field of Classification Search
CPC .............. H04B 1/04; H04B 2001/0408; H04B 2001/0491
USPC ....... 375/219, 220, 222, 295, 297, 298, 303, 375/304, 308; 370/278, 282; 332/103, 332/144; 455/102, 114.3
See application file for complete search history.

(56) References Cited

U.S. PATENT DOCUMENTS

| | | | |
|---|---|---|---|
| 2010/0167667 A1* | 7/2010 | Laporte | H01F 21/12 333/25 |
| 2010/0295629 A1 | 11/2010 | Klemens et al. | |
| 2016/0380592 A1* | 12/2016 | Rajendran | H03D 7/1425 455/118 |
| 2017/0019140 A1* | 1/2017 | Nick | H04B 1/48 |
| 2018/0351535 A1* | 12/2018 | Karmaker | H03F 3/45475 |
| 2019/0334483 A1* | 10/2019 | Balteanu | H03F 1/56 |
| 2021/0105038 A1* | 4/2021 | Park | H04B 1/40 |

FOREIGN PATENT DOCUMENTS

| | | |
|---|---|---|
| EP | 2750291 A2 | 7/2014 |
| WO | 2011104313 A1 | 9/2011 |
| WO | 2016209477 A1 | 12/2016 |
| WO | 2019118128 A1 | 6/2019 |

OTHER PUBLICATIONS

Partial International Search Report—PCT/US2021/018808—ISA/EPO—dated Jun. 4, 2021 11 pages.

* cited by examiner

MULTIBAND TRANSMITTER

CROSS-REFERENCE TO RELATED APPLICATION

This application claims the benefit of U.S. Provisional Application No. 62/978,729, filed 19 Feb. 2020, the disclosure of which is hereby incorporated by reference in its entirety herein.

TECHNICAL FIELD

This disclosure relates generally to wireless communication and, more specifically, to a multiband transmitter.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants (e.g., smart speakers), wireless access points or routers, thermostats and other sensors or automated controllers, robotics, automotive electronics, devices embedded in other machines like refrigerators and industrial tools, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between two or more electronic devices using wireless or wired signals that are transmitted over one or more networks, such as the Internet, a Wi-Fi network, or a cellular network. Electronic communications therefore include both wireless and wired transmissions and receptions. To make such electronic communications, an electronic device can use a transceiver, such as a wireless transceiver for wireless communications.

Electronic communications can therefore be realized by propagating signals between two wireless transceivers at two different electronic devices. For example, using a wireless transmitter, a smartphone can transmit a wireless signal to a base station over an air medium as part of an uplink communication to support mobile services. Using a wireless receiver, the smartphone can receive a wireless signal that is transmitted from the base station via the air medium as part of a downlink communication to enable mobile services. With a smartphone, mobile services can include phone and video calls, social media interactions, messaging, watching movies, sharing videos, performing searches, acquiring map information or navigational instructions, finding friends, location-based services generally, transferring money, obtaining another service like a car ride, and so forth.

Many of these mobile services depend at least partly on the transmission and reception of wireless signals. Consequently, electrical engineers and other designers of electronic devices strive to develop wireless interface devices that can facilitate providing these and other mobile services by effectively communicating wireless signals.

SUMMARY

Wireless signals can be transmitted in accordance with various wireless standards using a wireless interface device. These various wireless standards specify particular frequency bands that can be used for signal transmission. To interoperate with multiple wireless standards or multiple frequency bands of a given wireless standard, a wireless interface device can be capable of transmitting signals in multiple frequency ranges. In some cases, a wireless interface device devotes a respective communication chain (e.g., a transmit chain or a receive chain) to each respective frequency band, which increases both size and cost of the wireless interface device and thus the associated electronic device. To lower the size and cost, this document describes at least portions of a transmit chain that can process signals across different frequency ranges, including non-overlapping and noncontiguous frequency ranges.

In example implementations, a transmitter of a wireless interface device includes a mixer that is realized as an upconverter, a mixer load that is realized as a tunable filter, and a driver amplifier. The tunable filter operates to smoothly couple an upconverted signal from the upconverter to the driver amplifier for subsequent transmission via an antenna. The tunable filter can filter signals in multiple frequency ranges. For example, the tunable filter may include a tunable inductive-capacitive tank (LC tank) with an adjustable inductor or an adjustable capacitor, including adjustable versions of both components. Additionally or alternatively, in some implementations, the driver amplifier includes a multiband/shared section that amplifies signals in multiple frequency ranges and a split-band/focused section having individual amplifiers that each amplify signals in a subset of the multiple frequency ranges. The frequency-upconverted, filtered, and amplified signal that is produced can be forwarded to the antenna for transmission. In these manners, at least parts of what would otherwise constitute multiple separate transmit chain portions can be merged together into a single transmit chain portion to reduce the size and cost of a wireless interface device.

In an example aspect, an apparatus for processing signals for wireless transmission is disclosed. The apparatus includes a wireless interface device. The wireless interface device includes an upconverter, a tunable filter, and a driver amplifier. The upconverter has an output and is configured to upconvert a baseband frequency to a radio frequency based on a local oscillator signal. The tunable filter has an input and an output; the input of the tunable filter is coupled to the output of the upconverter. The driver amplifier has an input, and the input of the driver amplifier is coupled to the output of the tunable filter.

In an example aspect, an apparatus for processing signals for wireless transmission is disclosed. The apparatus includes means for upconverting signals at one or more baseband frequencies to two or more radio frequencies to produce upconverted signals, with the upconverted signals corresponding a first frequency range and a second frequency range. The apparatus also includes means for filtering the upconverted signals to produce filtered signals, with the filtered signals corresponding to the first frequency range and the second frequency range. The apparatus further includes means for amplifying the filtered signals to produce amplified signals, with the amplified signals corresponding to the first frequency range and the second frequency range.

In an example aspect, a method for processing signals for wireless transmission is disclosed. The method includes upconverting, using an upconverter, a first signal at a baseband frequency to a radio frequency to produce a first upconverted signal, with the first upconverted signal corresponding to a first frequency range. The method also includes filtering, using a tunable filter, the first upconverted signal to produce a first filtered signal and amplifying, using a driver amplifier, the first filtered signal to produce a first amplified signal. The method additionally includes upconverting, using the upconverter, a second signal at a baseband frequency to another radio frequency to produce a second upconverted signal, with the second upconverted signal corresponding to a second frequency range. The method further includes filtering, using the tunable filter, the second upconverted signal to produce a second filtered signal and amplifying, using the driver amplifier, the second filtered signal to produce a second amplified signal.

In an example aspect, an apparatus for processing signals for wireless transmission is disclosed. The apparatus includes a wireless interface device. The wireless interface device includes an upconverter and a driver amplifier. The upconverter has a load circuit portion including an adjustable inductor in parallel with a capacitor. The driver amplifier is coupled to the upconverter and includes a multiband section and a split-band section. The multiband section includes a main amplifier, with the main amplifier coupled to an input of the driver amplifier. The split-band section includes a first cascode amplifier and a second cascode amplifier. The first cascode amplifier is coupled between the main amplifier and a first output of the driver amplifier, and the second cascode amplifier is coupled between the main amplifier and a second output of the driver amplifier.

BRIEF DESCRIPTION OF DRAWINGS

FIGS. 8-1 to 8-3 illustrate example implementations of an upconverter and tunable filter combination that include a shunt inductor between plus and minus parts of differential circuitry.

DETAILED DESCRIPTION

Figure 1:
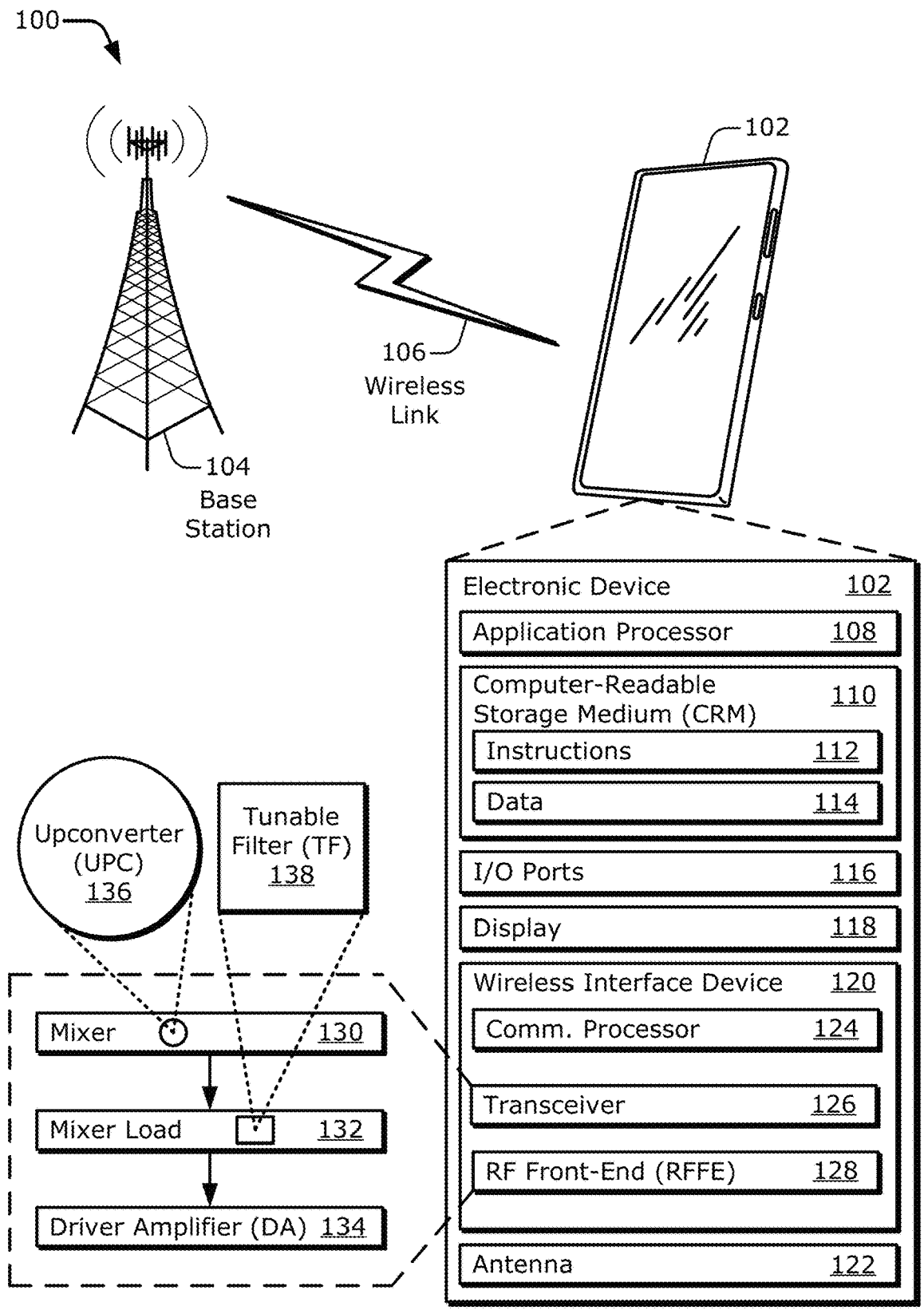
FIG. 1 illustrates an example environment with an example electronic device including a wireless interface device, which has a mixer and a mixer load.

To provide mobile services, electronic devices typically use a wireless transceiver to communicate wireless signals in accordance with some wireless standard. Examples of wireless standards include a 4th Generation (4G) cellular standard and an IEEE 802.11b or 802.11g Wi-Fi standard, which have both been used with smartphones and other connected devices. These wireless standards enable a certain wireless communication speed across a few frequency ranges. Efforts are ongoing, however, to enable faster wireless networks through the creation of newer wireless standards with a greater quantity of frequency ranges to improve capabilities. Next-generation cellular networks and advanced Wi-Fi networks, for example, can offer significantly higher bandwidths, lower latencies, and access to additional electromagnetic (EM) spectrum. Taken together, this means that exciting new wireless services can be provided to users, such as safer self-driving vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smartphones and other traditional computing devices will be deployed, which is sometimes called the "Internet of Things" (IoT). Compared to today's use of wireless devices, tens of billions, and eventually trillions, of more devices are expected to be connected to the internet with the Internet of Things. These IoT devices may include small, inexpensive, and low-powered devices, like sensors and tracking tags. Some portion of such IoT devices may therefore particularly benefit from smaller or less expensive components.

Further, to enable next-generation wireless technologies, IoT devices and other electronic devices may operate in accordance with 5th Generation (5G) cellular standards and newer Wi-Fi standards. Such devices may communicate with signals that use wider frequency ranges that are located at higher frequencies of the EM spectrum as compared to those devices that operate in accordance with older wireless standards. For example, many newer devices will be expected to operate at millimeter wave (mmWave) frequencies (e.g., frequencies between at least 24 and 300 Gigahertz (GHz)), as well as at frequencies in the single-digit GHz. These new wireless standards expand the range of frequencies at which electronic devices can communicate.

To meet these commercial expectations and accommodate the expansion of usable frequency ranges, the physical components that enable wireless communications under these constraints will be expected to operate at multiple GHz frequency ranges. One component that facilitates electronic communication is the wireless interface device, which can include a wireless transceiver and a radio-frequency front-end (RFFE). Unfortunately, the wireless interface devices designed for electronic devices that operate in accordance with older Wi-Fi and cellular standards may be incapable of operating with, or economically infeasible with, the faster Wi-Fi and 5G wireless standards. These new wireless standards can operate with higher frequencies, can offer additional frequency ranges, and may involve more-stringent latency demands.

Further, as new wireless standards are developed and implemented, use of earlier standards can continue, such as for backward compatibility or utilization of existing electromagnetic (EM) frequency allocations. Previous or current wireless standards can also evolve to incorporate additional EM frequency allocations. Thus, older and newer wireless standards may be associated with various frequency bands with respect to each other and as each evolves over time. Electronic devices, therefore, may be designed to operate in accordance with different wireless standards, different generations of a given wireless standard, and/or otherwise across multiple frequency ranges. To operate across multiple frequency ranges, an electronic device can include multiple different receive and transmit chains, such as one communication chain respectively per frequency range.

Duplication of communication chains, however, entails some costs. For example, each duplicated communication chain is associated with a financial cost to replicate various components across the multiple chains. Additionally, each separate communication chain occupies some finite amount of space, so each instance of a communication chain causes a wireless interface device, and an electronic device thereof, to be larger. These traits can conflict with a size preference for those devices in which smaller form factors may be preferred, such as an IoT sensor or a smartwatch. As the quantity of wireless standards (including different generations thereof) and associated frequency bands increases, the impact of having individual communication chains for each enabled frequency band also increases. For example, some newer wireless local area network (LAN) (WLAN) standards (e.g., for Wi-Fi) envision three frequency bands in the Gigahertz (GHz) range. An example triband WLAN environment includes a 2 GHz band (e.g., 2.4 GHz), a 5 GHz band (e.g., 4.9-6 GHz), and a 6 GHz band (e.g., 6-7.2 GHz). Including fully separate transmit or receive chains respectively for each of the three bands can result in electronic devices that are more expensive and larger—and may therefore be less affordable and less portable—than is desired.

To counteract the increasing numbers of communication chains, an electronic device can deploy a communication chain that accommodates frequencies spread across two or more different bands, including noncontiguous frequency bands. The farther apart two frequency bands are, or the higher the related frequencies along the EM spectrum, the more difficult it generally becomes to enable signals having two different frequencies to share even part of a single communication chain. Because the parts of a communication chain that are closest to an antenna typically process signals with the highest frequencies, it can be more challenging to share components in these parts of a communication chain. These parts of communication chains often process radio-frequency (RF) signals, which are higher than both intermediate frequency (IF) signals and baseband frequency (BBF) signals. Inductors, for instance, are employed in communication chains to condition signals for transmission. Such inductors may be relatively large components that are particularly sensitive to diverse frequency ranges, especially at higher frequencies.

To address these issues, described implementations enable at least some of the components of a communication chain to be shared across at least two frequency bands. In other words, instead of forking a transmit chain into two paths at the start of an RF portion, this document describes extending a shared portion of a transmit chain at least partially into the RF portion thereof. For example, a mixer of a communication chain—e.g., a frequency upconverter of a transmit chain—can be shared between two or more frequency bands. Further, in some implementations, at least part of a driver amplifier that accepts a frequency-upconverted signal can be shared across multiple frequency bands. In some environments, the frequency upconverter produces a frequency-upconverted signal that is at RF after the up-conversion based on a BBF signal or an IF signal. In a direct-conversion architecture, for instance, the upconverter can "directly" translate a signal having a BBF to one having a RF based on a local oscillator signal. In some architectures, digital signal processing is performed at BBF, such as by a digital signal processor (DSP) or a modem. A wireless signal that is being transmitted can be emanated from an antenna at a particular RF in accordance with a given wireless standard. Thus, a transmit chain can propagate and condition a signal at BBF in one portion of the chain and at RF in another portion of the chain. With a direct-conversion transmitter, a transmit chain can bypass or "skip over" signal propagation or processing at IF by upconverting form BBF to RF.

In example implementations, component sharing at RF across multiple radio frequency ranges can be facilitated with a frequency upconverter using a load that is configurable. The configurable load can be realized using a tunable filter that can be programmed to resonate at multiple frequencies corresponding to multiple frequency bands. The tunable filter can include an adjustable capacitor or an adjustable inductor, including both an adjustable capacitor and an adjustable inductor. In some cases, the adjustable inductor is realized as two or more inductors that can be selectively coupled into a path of a communication signal using one or more switches. The tunable filter can couple an upconverted signal to a succeeding component, such as a driver amplifier, along the transmission chain with lower attenuation, distortion, or reflection. The tunable filter can be tuned by adjusting the adjustable capacitor or the adjustable inductor (including by adjusting both) based on the particular RF of a signal being currently processed for transmission. In an example WLAN environment with a configurable mixer load, the tunable filter can be selectively tuned, for instance, for a 2 GHz band (e.g., around 2.4 GHz) and for a combined 5 GHz and 6 GHz band (e.g., around 4.9-6 GHz and 6-7.2 GHz).

Thus, in example implementations, a configurable load of an upconverting mixer can provide a signal-friendly coupling of a communication signal from an upconverter to a driver amplifier. Consequently, a tunable filter in conjunction with the driver amplifier can support wideband operation of a transmit chain. The components can provide a graceful transition from the upconverter for RF signaling that enables shared components of the transmit chain to be extended into the RF portion of the transmit chain. In other example implementations, the driver amplifier can include a multiband/shared section and a split-band/focused section. If the multiband/shared section of the driver amplifier is included in the transmit chain, at least some components of the driver amplifier can thus be shared across different frequency ranges. In these manners, by sharing at least a portion of a transmit chain for RF signals corresponding to different frequency ranges, electronic devices can be smaller and less expensive.

FIG. 1 illustrates an example environment 100 with an electronic device 102 having a wireless interface device 120, which includes a transceiver 126 and an RF front-end 128 (RFFE 128). As shown, the transceiver 126 or the RF front-end 128, or a combination thereof, includes a mixer 130, a mixer load 132, and a driver amplifier 134 (DA 134). These components are described further below. In the environment 100, the example electronic device 102 communicates with a base station 104 through a wireless link 106. In FIG. 1, the electronic device 102 is depicted as a smartphone. The electronic device 102 may, however, be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, a wireless device with a fiber optic line, another electronic device as described above generally, and so forth. Hence, the electronic device 102 may communicate with the base station 104 or another device via at least a wired connection.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using at least one instance of any suitable communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi 6 or WiGig®); an IEEE 802.16 standard (e.g., WiMAX®); a Bluetooth® standard; and so forth. In some implementations, the wireless link 106 may provide power wirelessly, and the electronic device 102 or the base station 104 may comprise a power source.

As shown, the electronic device 102 can include at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

As illustrated, the electronic device 102 further includes at least one wireless interface device 120 and at least one antenna 122. The wireless interface device 120 provides connectivity to respective networks and peer devices via a wireless link, which may be configured similar to or differently from the wireless link 106. Alternatively or additionally, the electronic device 102 may include a wired interface device (not shown), such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 using the wireless interface device 120. The electronic device 102 may, however, communicate directly with peer devices, an alternative wireless network, and the like.

The wireless interface device 120 can include at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem baseband processor, or as a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, or other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately shown) to store data and processor-executable instructions (e.g., code), such as a CRM 110.

The various components illustrated in FIG. 1 (and in other figures) using separate schematic blocks may be manufactured or packaged in different discrete or integrated manners. For example, one physical module may include components of the RF front-end 128 and a portion of the components of the transceiver 126, and another physical module may combine the communication processor 124 with the remaining components of the transceiver 126. Additionally or alternatively, at least one antenna array of the antenna 122 may be co-packaged with at least some components of an RF front-end 128 as an antenna module. Further, an electronic device 102 may include multiple such antenna modules, thereby spatially distributing various physical components of at least one RF front-end 128 within a housing of the electronic device 102. Thus, in some implementations, a mixer 130 and a mixer load 132, for example, may be present in each antenna module of multiple antenna modules.

The transceiver 126 can include circuitry and logic for filtering, switching, amplification, channelization, frequency translation, and so forth. Frequency translation functionality may include an up-conversion or a down-conversion of signal frequency that is performed through a single conversion operation (e.g., with a direct-conversion architecture) or through multiple conversion operations (e.g., with a superheterodyne architecture). The frequency translation can be accomplished using a mixer in conjunction with a local oscillator (LO) (not shown in FIG. 1). Generally, the transceiver 126 includes filters, switches, amplifiers, mixers, and so forth for routing and conditioning signals that are transmitted or received via the antenna 122.

The transceiver 126 can include an analog-to-digital converter (ADC) or a digital-to-analog converter (DAC) (not shown in FIG. 1). In operation, an ADC can convert from analog signals to digital signals, and a DAC can convert from digital signals to analog signals. An ADC or a DAC can be implemented as part of the communication processor 124, as part of the transceiver 126, or separately from both of them (e.g., as another part of an SoC or as part of the application processor 108).

Figure 2:
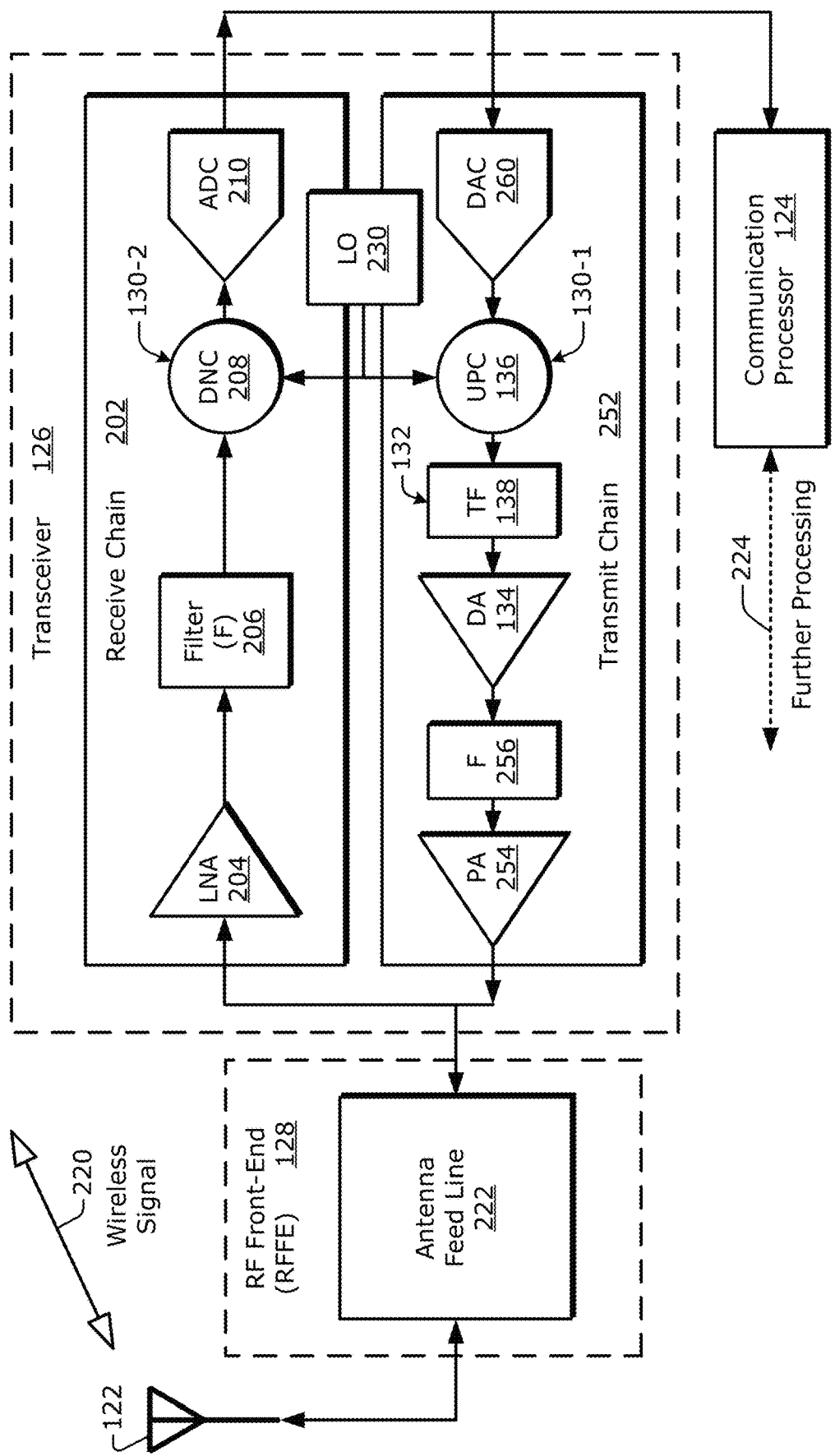
FIG. 2 illustrates an example transceiver with an example transmit chain that includes an upconverter implementation of a mixer and a tunable filter implementation of a mixer load.

The components or circuitry of the transceiver 126 can be implemented in any suitable fashion, such as with combined transceiver logic or separately as respective transmitter and receiver entities. In some cases, the transceiver 126 is implemented with multiple or different sections (e.g., multiple communication chains) to implement respective transmitting and receiving operations (e.g., with separate transmit chains and receive chains as depicted in FIG. 2). The RF front-end 128 may likewise have combined transmit and receive components or have fully or partially separated transmit and receive chains. Although not shown in FIG. 1, the transceiver 126 may include logic to perform in-phase/quadrature (I/Q) operations, such as synthesis, phase correction, modulation, demodulation, and the like.

Generally, the RF front-end 128 includes one or more filters, switches, amplifiers, or mixers for conditioning signals received via the antenna 122 or signals to be transmitted via the antenna 122. The RF front-end 128 may include a phase shifter (PS), peak detector, power meter, gain control block, antenna tuning circuit, N-plexer, balun, and the like. As discussed below, an RF front-end 128 can additionally or alternatively include other components, such as a mixer, a mixer load, or a driver amplifier. Configurable components of the RF front-end 128, such as a phase shifter, programmable mixer load, or automatic gain controller (AGC), may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

As illustrated in FIG. 1, the wireless interface device 120 also includes at least one mixer 130, at least one mixer load 132, and at least one driver amplifier 134 (DA 134). In some implementations, the transceiver 126 includes the mixer 130, the mixer load 132, and the driver amplifier 134. In other implementations, the RF front-end 128 includes the mixer 130, the mixer load 132, and the driver amplifier 134. In still other implementations, these components can be distributed between at least the transceiver 126 and the RF front-end 128. For example, the transceiver 126 can include a portion of these components, and the RF front-end 128 can include another portion of these components, such as the remaining components. In a transmit chain implementation, for instance, a transmitter of the transceiver 126 can include the mixer 130 and the mixer load 132, and the RF front-end 128 can include the driver amplifier 134.

Generally, the mixer 130 can be implemented with a downconverter (a frequency downconverter) or an upconverter (a frequency upconverter). For an example multiband transmitter, the mixer 130 can be implemented using an upconverter 136 (UPC 136), and the mixer load 132 can include a tunable filter 138 (TF 138). These and additional aspects of the wireless interface device 120 are described below with reference to FIG. 2. The example implementation of the wireless interface device 120 that is depicted in FIG. 2 includes both a transmit chain and a receive chain. Although the mixer 130, the mixer load 132, and the driver amplifier 134 are shown as being part of the transmit chain in FIG. 2, this is by way of example only.

FIG. 2 illustrates, at 200 generally, an example transceiver 126 that includes multiple mixers at 130-1 and 130-2. The upconverter 136 implementation of the mixer 130-1 is coupled to a mixer load 132 that can be configurable and implemented as a tunable filter 138. FIG. 2 further depicts the antenna 122, the RF front-end 128, and the communication processor 124. As illustrated from left to right, the antenna 122 is coupled to the RF front-end 128, and the RF front-end 128 is coupled to the transceiver 126. The transceiver 126 is coupled to the communication processor 124. The example RF front-end 128 includes at least one antenna feed line 222. The example transceiver 126 includes at least one receive chain 202 and at least one transmit chain 252. Although only one RF front-end 128, one transceiver 126, and one communication processor 124 are explicitly shown at 200, an electronic device 102, or a wireless interface device 120 thereof, can include multiple instances of any or all such components. Also, although only certain components are explicitly depicted in FIG. 2 and are shown coupled together in a particular manner, the transceiver 126 and the RF front-end 128 may include other non-illustrated components, more or fewer components, differently-coupled arrangements of components, and so-forth.

In example implementations, the RF front-end 128 couples the antenna 122 to the transceiver 126 via the antenna feed line 222. In operation, the antenna feed line 222 propagates a signal between the antenna 122 and the transceiver 126. During or as part of the propagation, the antenna feed line 222 conditions the propagating signal. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220 (e.g., at a radio frequency (RF)). Although not explicitly shown in FIG. 2, an RF front-end 128, or an antenna feed line 222 thereof, may include one or more other components, such as a filter, an amplifier (e.g., a power amplifier, a low-noise amplifier, or a driver amplifier), an N-plexer, a phase shifter, a mixer, and so forth. Further, although depicted as part of the transceiver 126 in FIG. 2, the mixer 130-1 (e.g., the upconverter 136), the mixer 130-2 (e.g., a downconverter 208), the mixer load 132 (e.g., the tunable filter 138), and/or the driver amplifier 134 may be implemented as part of the RF front-end 128.

In some implementations, the transceiver 126 can include at least one communication chain. More specifically, the transceiver 126 can include at least one receive chain 202, at least one transmit chain 252, or both at least one receive chain 202 and at least one transmit chain 252. The receive chain 202 includes at least a low-noise amplifier 204 (LNA 204), a filter 206, the mixer 130-2 that is implemented as a downconverter 208 (DNC 208) for frequency down-conversion, and an ADC 210. From left-to-right, the transmit chain 252 includes at least a power amplifier 254 (PA 254), a filter 256 (F 256), the mixer 130-1 that is implemented as the upconverter 136 for frequency up-conversion, and a DAC 260. In accordance with described implementations, the transmit chain 252 also includes a driver amplifier 134 and the mixer load 132 that is implemented as the tunable filter 138. The driver amplifier 134 and the tunable filter 138 are coupled together in series between the upconverter 136 and the filter 256. In alternative implementations, an output of the driver amplifier 134 can be coupled to at least one balun (e.g., instead of or "before" the filter 256), as is described below with reference to FIGS. 3 and 4.

The transceiver 126 also includes at least one local oscillator 230 (LO 230) that generates at least one local oscillator (LO) signal. The receive chain 202 and/or the transmit chain 252 may each include an individual respective LO 230. Thus, the transceiver 126 can include at least one LO 230, one LO for each transmit/receive chain pair, one LO per transmit chain and one LO per receive chain, multiple LOs, and so forth. Further, the receive chain 202 or the transmit chain 252 can include other components—such as additional amplifiers or filters, multiple mixers, one or more buffers, at least one balun, or another local oscillator—that are electrically coupled anywhere along the depicted receive and transmit chains. The receive chain 202 is coupled between the antenna feed line 222 of the RF front-end 128 and the communication processor 124 via, e.g., the low-noise amplifier 204 and the ADC 210, respectively. The transmit chain 252 is coupled between the antenna feed line 222 and the communication processor 124 via, e.g., the power amplifier 254 and the DAC 260, respectively.

As shown for the receive chain 202, the antenna 122 is coupled to the low-noise amplifier 204 via the antenna feed line 222, and the low-noise amplifier 204 is coupled to the filter 206. The filter 206 is coupled to the downconverter 208, and the downconverter 208 is coupled to the ADC 210. The ADC 210 is in turn coupled to the communication processor 124. As shown for the transmit chain 252, the communication processor 124 is coupled to the DAC 260, and the DAC 260 is coupled to the upconverter 136. The upconverter 136 is coupled to the tunable filter 138, and the tunable filter 138 is coupled to the driver amplifier 134. Further, the driver amplifier 134 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components.

An example signal-receiving operation that includes the receive chain 202 of the transceiver 126 is now described. As part of the signal-receiving operation, the antenna 122 receives a wireless signal 220. The antenna 122 can be implemented as an individual antenna, as an antenna array, as an antenna element of an antenna array, and so forth. The antenna 122 provides the wireless signal 220 to the RF front-end 128, and the RF front-end 128 uses the antenna feed line 222 to forward the corresponding wired signal to the transceiver 126. Thus, the antenna 122 provides the wireless signal 220 to the low-noise amplifier 204 of the receive chain 202 after conditioning or other signal manipulation by the antenna feed line 222 or other components of the RF front-end 128. The low-noise amplifier 204 amplifies the manipulated signal to produce an amplified signal. The low-noise amplifier 204 provides the amplified signal to the filter 206. The filter 206 filters (e.g., low-pass filters or bandpass filters) the amplified signal by attenuating some range or ranges of frequencies to produce a filtered signal that has one or more frequency bands attenuated. The filter 206 provides the filtered signal to the downconverter 208.

The downconverter 208 performs a frequency conversion operation on the filtered signal to down-convert from one frequency to a lower frequency, such as from a radio frequency (RF) to an intermediate frequency (IF) or to a baseband frequency (BBF). For a direct-conversion frequency translation, the downconverter 208 can convert an RF signal directly to a BBF signal in a single conversion operation by "bypassing" an IF-signal stage. Alternatively, for a superheterodyne-conversion frequency translation, the downconverter 208 can convert an RF signal to an IF signal in a first operation. The same downconverter 208 or a different downconverter can convert the IF signal to a BBF signal in a second operation. In other words, the downconverter 208, or multiple such downconverters, can perform the frequency down-conversion in a single conversion step, or through multiple conversion steps, using at least one LO 230 that generates a signal having a synthesized frequency, e.g., using a phase-locked loop (PLL).

Thus, the downconverter 208 accepts the filtered signal from the filter 206 and performs a frequency down-conversion operation on the filtered signal to produce a down-converted signal. The downconverter 208 provides the down-converted signal to the ADC 210. The ADC 210 converts the analog down-converted signal to a digital signal. The ADC 210 provides the digital signal to the communication processor 124. The communication processor 124 can perform demodulation, decoding, and so forth on the digital signal to produce a data signal. The communication processor 124 then provides the data signal to other components, such as the application processor 108 (of FIG. 1), for further processing at 224 (e.g., for processing at an application level).

As part of an example signal-transmitting operation that includes the transmit chain 252, the DAC 260 accepts a digital signal from the communication processor 124. The DAC 260 converts the digital signal to an analog signal, which is at a baseband frequency (BBF) or an intermediate frequency (IF). The upconverter 136 accepts the analog signal from the DAC 260. The upconverter 136 upconverts the analog signal to a higher frequency, such as an RF frequency, to produce a transmission signal using a local oscillator signal generated by the LO 230 to have a target synthesized frequency. The target synthesized frequency can serve as a carrier frequency (e.g., a carrier radio frequency) for a targeted frequency band for the wireless signal 220.

For a direct-conversion frequency translation, the upconverter 136 can convert a BBF signal directly to an RF signal in a single conversion operation by "bypassing" an IF-signal stage. Alternatively, for a superheterodyne-conversion frequency translation, the upconverter 136 can convert a BBF signal to an IF signal in a first operation. The same upconverter 136 or a different upconverter can convert the IF signal to an RF signal in a second operation. The upconverter 136 provides the RF signal to the driver amplifier 134 via the tunable filter 138. In addition to the upconverter 136, the tunable filter 138, and at least part of the driver amplifier 134, can process signals that span two or more frequency bands, which bands may be noncontiguous. This multiband capability is described below with reference to FIGS. 3 and 4.

The tunable filter 138 as the mixer load 132 provides a transition for multiband signals between an output of the upconverter 136 and an input of the driver amplifier 134. The tunable filter 138 filters the upconverted signal and provides the filtered, frequency-upconverted signal to the driver amplifier 134. The driver amplifier 134 amplifies the filtered RF signal, which is produced by the upconverter 136 and obtained via the tunable filter 138, to produce an amplified RF signal. The driver amplifier 134 provides the amplified RF signal to the filter 256. The driver amplifier 134 may provide the amplified RF signal to the filter 256 via at least one balun, as is described below for FIGS. 3 and 4. The filter 256 filters the amplified RF signal to attenuate one or more frequency ranges, which may include one or more harmonics produced by the driver amplifier 134, and produces a filtered signal. The filter 256 provides this filtered signal to the power amplifier 254. The power amplifier 254 amplifies the filtered signal to generate another amplified signal.

The power amplifier 254 provides this amplified signal to the antenna feed line 222 for signal conditioning. The RF front-end 128 uses the antenna feed line 222 to provide the conditioned signal to the antenna 122 for emanation as another wireless signal 220 at a radio frequency (RF). The communication chains depicted in FIG. 2 and described above provide example implementations. A multiband transmitter can, however, be implemented in alternative manners. For example, an output of the driver amplifier 134 can be coupled to at least one balun, as is described below with reference to FIGS. 3 and 4.

The upconverter 136 as at least part of the mixer 130-1, the tunable filter 138 as at least part of the mixer load 132, and the driver amplifier 134 are generally described herein in terms of being part of an RF section of a transmit chain 252 "after" the upconverter 136 upconverts directly from BBF to RF (or from IF to RF in a multi-stage conversion operation). These components can, however, be implemented elsewhere or in different manners. For example, these components can instead be incorporated as part of an IF section of a transmit chain 252 after an upconverter 136 as a mixer 130-1 upconverts from BBF to IF. Alternatively, one or more of these components can be implemented in a receive chain 202. For example, the mixer 130-2 can realize the downconverter 208 that translates from RF to IF, from IF to BBF, or "directly" from RF to BBF. In such cases, a mixer load 132 (e.g., a tunable filter 138) can be coupled between an output of the frequency downconverter 208 and the ADC 210 (this example is not depicted in FIG. 2). In any of these cases, the driver amplifier 134 can be coupled directly or indirectly to the mixer load 132, or the driver amplifier 134 may be excluded from the communication chain.

Figure 3:
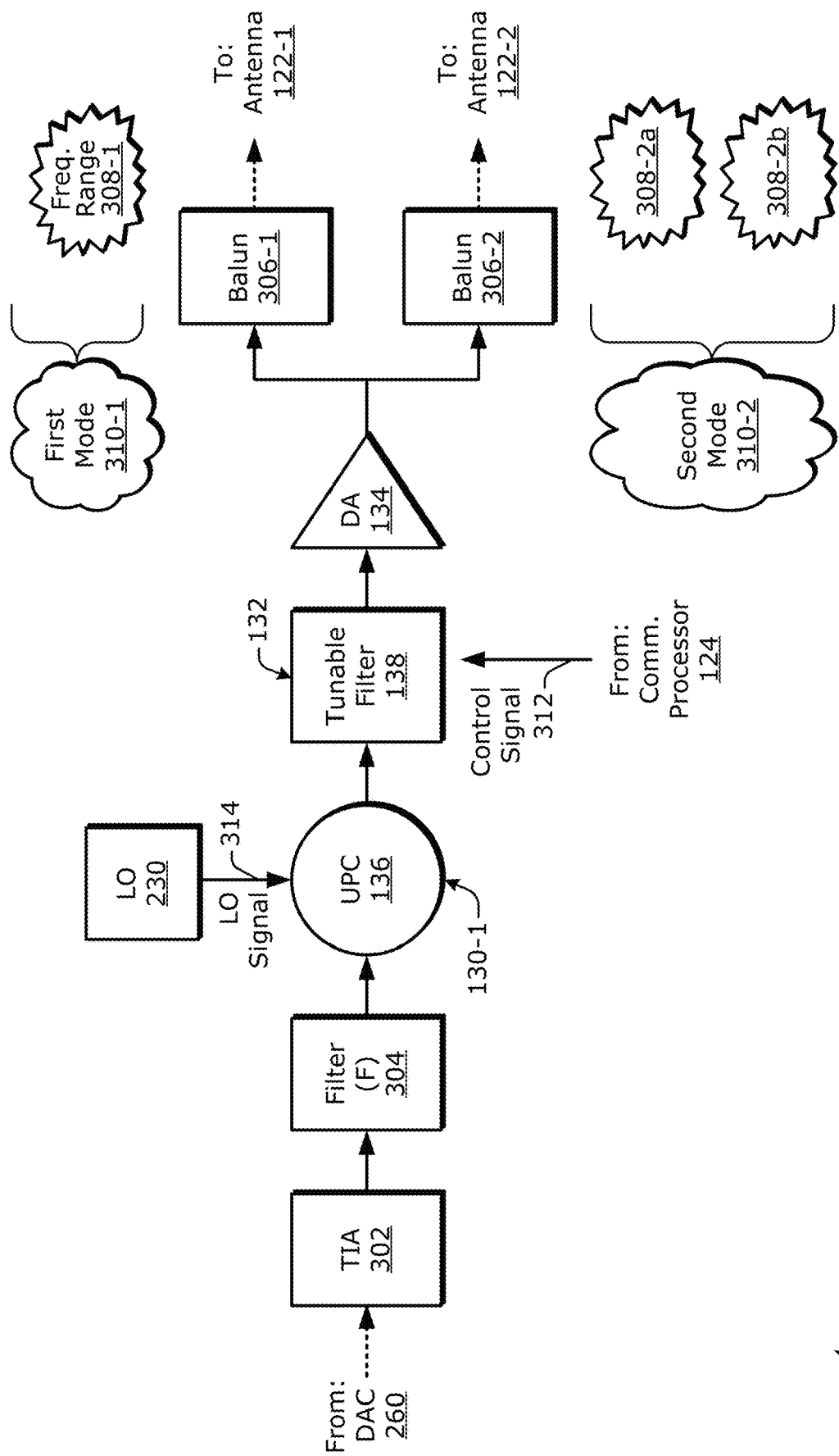
FIG. 3 illustrates an example transmit chain including an upconverter, a tunable filter, and a driver amplifier.

FIG. 3 illustrates another example transmit chain 252 including an upconverter 136 implementation of a mixer 130-1, a mixer load 132 that includes a tunable filter 138, and a driver amplifier 134. The transmit chain 252 can additionally include a transimpedance amplifier 302 (TIA 302), a filter 304, and at least one balun 306. As shown, transmitter signals can propagate from left-to-right from the transimpedance amplifier 302 to the balun 306. For example, a signal can propagate from the transimpedance amplifier 302 to the filter 304 and from the filter 304 to the upconverter 136. After up-conversion, the signal can continue to propagate from the upconverter 136 to the tunable filter 138 and from the tunable filter 138 to the driver amplifier 134. The driver amplifier 134 can couple the signal to at least one balun 306. The transmitter of the transmit chain 252 can operate in at least one mode 310 of multiple modes 310-1 to 310-2 that respectively corresponds to at least one frequency range 308 of multiple frequency ranges 308-1 to 308-2.

In example implementations, the transimpedance amplifier 302 accepts a signal directly or indirectly from the DAC 260 or the communication processor 124 of FIG. 2. The transimpedance amplifier 302 converts a current-based signal to a voltage-based signal. The transimpedance amplifier 302 provides the converted, voltage-based signal to the filter 304. The filter 304 may be implemented as, for instance, a second order filter that filters the converted signal to produce a filtered signal. The filter 304 provides the filtered signal to the upconverter 136.

In example transmitter implementations, the upconverter 136 upconverts the filtered signal to a higher frequency, such as to a RF from an IF or to a RF from a BBF, to produce an RF signal. To do so, the upconverter 136 can use an oscillating signal (e.g., a local oscillator signal 314) generated by the LO 230 so that the output RF signal is within one of two or more targeted frequency bands (e.g., in a different targeted frequency band at different times for different modes 310) for multiband scenarios. The upconverter 136 provides the RF signal to the driver amplifier 134 via the tunable filter 138, which may be incorporated, e.g., as part of the mixer load 132. Thus, the upconverter 136 outputs the RF signal to the tunable filter 138. Generally, at least a portion of the wireless interface device 120 (of FIG. 1), such as a transmitter thereof, can bypass intermediate frequencies for transmission operations by frequency translating signals from the BBF "directly" to the RF in one conversion stage. Accordingly, the upconverter 136 may, for instance, be realized as a direct-conversion upconverter.

In alternative implementations, a mixer or mixer assembly can include the upconverter 136 and the tunable filter 138. In such cases, a mixer input can correspond to an input of the upconverter 136, and a mixer output can correspond to an output of the tunable filter 138. These alternative implementations are described further with reference to FIG. 5. The tunable filter 138 is configurable to handle the two or more targeted frequency bands. Examples of such configurability are described below also with reference to FIG. 5.

Figure 4:
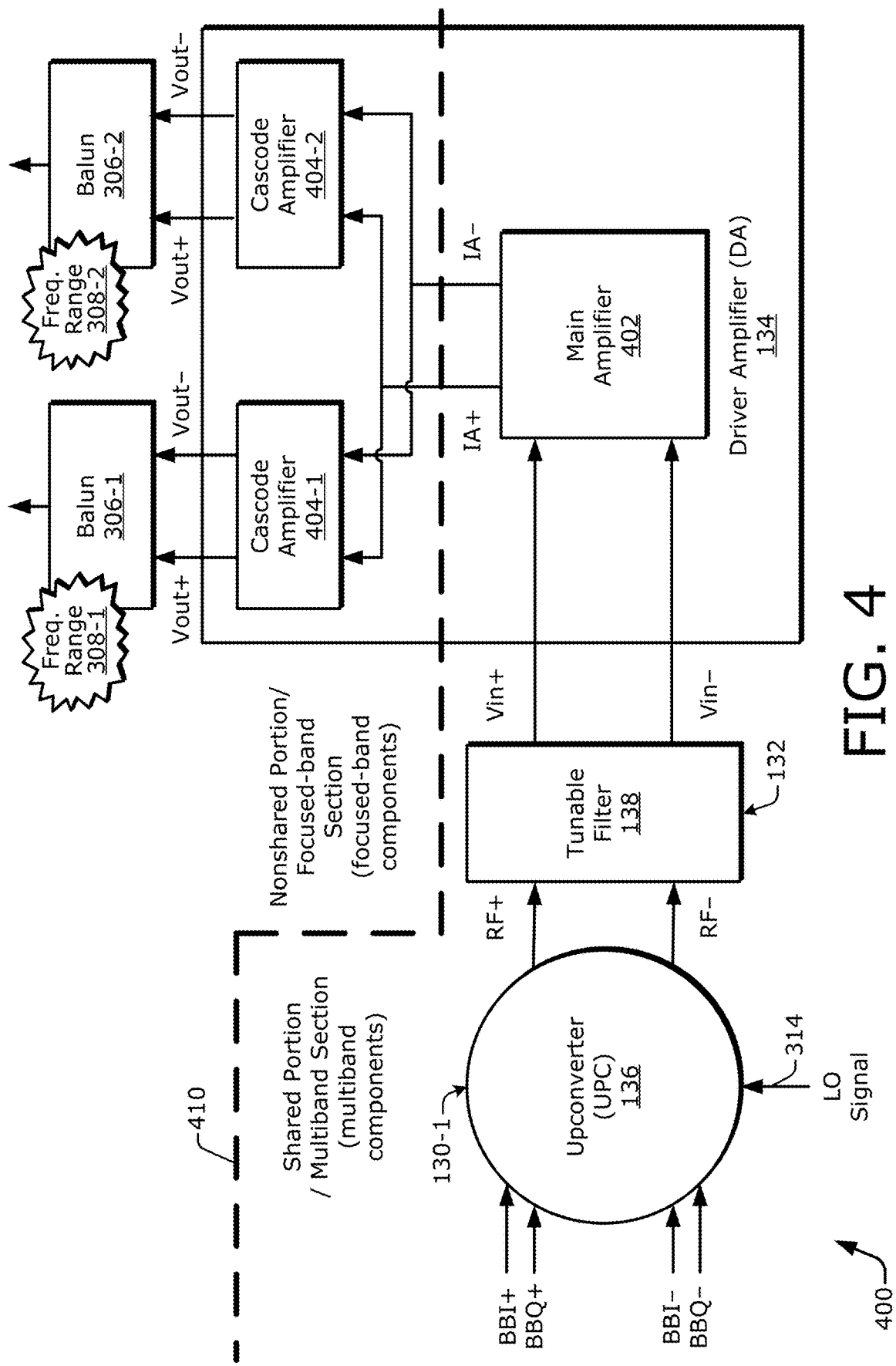
FIG. 4 illustrates an example portion of a transmit chain including an upconverter, a tunable filter, and a driver amplifier.
Figure 6:
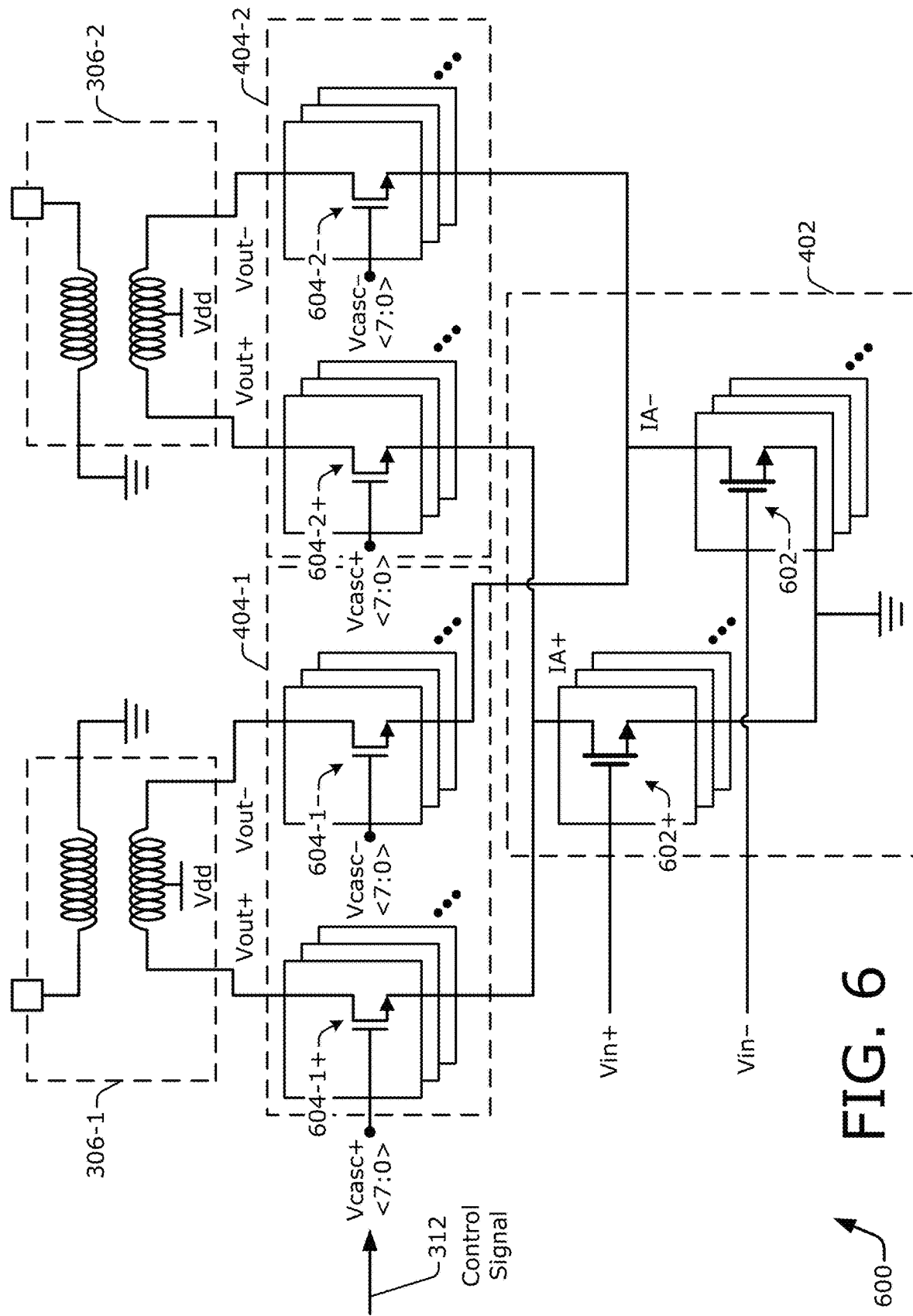
FIG. 6 illustrates an example driver amplifier and multiple baluns for multiple frequency ranges.

Continuing with FIG. 3, the tunable filter 138 couples the upconverted RF signal to an input of the driver amplifier 134. Thus, the driver amplifier 134 can accept the upconverted RF signal from the upconverter 136 via the tunable filter 138. The driver amplifier 134 amplifies the upconverted RF signal to produce an amplified RF signal. As shown in FIGS. 4 and 6, at least a portion of the driver amplifier 134 can include multiband components that are shared across two or more frequency ranges, including two different RF bands. The driver amplifier 134 outputs the amplified RF signal to provide the amplified RF signal to two or more baluns. As shown in FIG. 3, the transmit chain 252 includes a first balun 306-1 and a second balun 306-2. However, the transmit chain 252 can include more or fewer baluns. The driver amplifier 134 can therefore drive "N" baluns 306-1 . . . 306-N, with "N" representing an integer greater than one for some multiband scenarios.

Each balun 306 can change an RF signal from being differential (or balanced) to being single-ended (or unbalanced), or vice versa. After the signal balance is changed, each respective balun 306-1 and 306-2 forwards the changed RF signal to or towards a respective antenna 122-1 and 122-2. Although not explicitly shown in FIG. 3, one or more active or passive components may further condition the changed RF signal after being forwarded by a balun 306 and prior to the signal being coupled to the respective antenna 122. For example, at least one other filter (e.g., a filter 256 of FIG. 2) or at least one other amplifier (e.g., a power amplifier 254 of FIG. 2) may be coupled between an output of the balun 306 and an input of the antenna 122. Generally, components that can further process or condition an RF signal may operate on a signal after the driver amplifier 134 along the transmit chain 252, either before or after the balun 306.

Each respective balun 306-1 and 306-2 is associated with at least one respective frequency range 308-1 and 308-2 and thus may be selectively employed for at least one respective mode: a first mode 310-1 and a second mode 310-2. Each respective frequency range 308 may correspond to a respective frequency band of a respective wireless standard, wireless standard section, or wireless standard version. Further, at least one balun (e.g., balun 306-2) may be associated with multiple frequency ranges (e.g., second and third frequency ranges 308-2a and 308-2b) and thus multiple frequency bands. In some environments, a first frequency range 308-1 corresponds to a 2.4 GHz band for a WLAN wireless standard (e.g., a 2 GHz band). The second frequency range 308 2a corresponds to a 4.9-6 GHz band for the WLAN wireless standard (e.g., a 5 GHz band), and the third frequency range 308-2b corresponds to a 6-7.2 GHz band for the WLAN wireless standard (e.g., a 6 GHz band). Thus, a single balun (e.g., the second balun 306-2) may correspond to multiple frequency ranges and multiple frequency bands of at least one associated wireless standard while another balun (e.g., the first balun 306 1) may correspond to one frequency range and one frequency band of the same or a different wireless standard.

The transmit chain 252 may operate in different modes, such as at least two different modes: the first mode 310-1 and the second mode 310-2. The mode of operation may be controlled via at least one control signal 312. The control signal 312 is supplied to one or more components, such as the LO 230, the tunable filter 138, or the driver amplifier 134. Controllable components, such as a switch of the tunable filter 138 or a quantity of engaged transistors of the driver amplifier 134, are described below. The control signal 312 can be generated or provided by logic of the wireless interface device 120, which may be located at the communication processor 124 or the transceiver 126 (or the RF front-end 128). Thus, if a present operational mode is a first mode 310-1 that corresponds to a first frequency range 308-1, the communication processor 124 can issue a control signal 312 that tunes the tunable filter 138 based on the first frequency range 308-1. Although certain quantities of modes 310 (e.g., two) and of frequency ranges 308 (e.g., two to three) are depicted in FIG. 3 and described herein, a wireless interface device 120 or transmitter thereof may be implemented with a different quantity of either or both such modes and frequency ranges.

FIG. 4 illustrates an example portion 400 of a transmit chain for a transmitter that includes a mixer 130-1 that is implemented with an upconverter 136, a mixer load 132 that is implemented with a tunable filter 138, and a driver amplifier 134. As illustrated, and as indicated by a thick dashed line 410, the portion 400 is separated into a multiband section with multiband components and a focused-band section with focused-band components. The multiband section or shared portion has multiband components that can process signals for each frequency band (e.g., the first, second, and third frequency ranges 308-1, 308-2a, and 308-2b of FIG. 3) corresponding to the multiple baluns 306-1 to 306-2, which may be designed for a particular wireless standard. The split-band section or focused-band portion has focused-band components that can process signals for a respective frequency band or bands corresponding to a respective balun 306. Generally, these focused-band components may be incapable of properly processing signals for another frequency band that another component is capable of processing while meeting targeted specifications.

In example implementations, the upconverter 136 accepts as input an in-phase baseband signal (BBI) and a quadrature-phase baseband signal (BBQ). Each BBI and BBQ signal can include a plus part component or signal and a minus part component or signal of a differential signal. Although not shown for clarity, the LO signal 314 can also include four components, such as LOI+, LOI−, LOQ+, LOQ−. Based on the LO signal 314, the upconverter 136 outputs a plus RF (RF+) signal and a minus RF (RF−) signal (e.g., after combining the I and Q phase components of each respective plus and minus component). Thus, the upconverter 136 can upconvert the transmission signal, including the phase and/or differential components thereof, from one or more baseband frequencies directly to two or more radio frequencies based on at least one local oscillator signal 314.

To condition and/or process these multiband RF signals and to provide a transition between the upconverter 136 and the driver amplifier 134, the tunable filter 138 accepts the RF+ and RF− signals as at least part of a mixer load 132. As described with reference to FIG. 5, the tunable filter 138 is configurable in accordance with a selected frequency range 308. Generally, the tunable filter 138 includes one or more adjustable components, such as an adjustable inductor or an adjustable capacitor, having programmable reactance values to enable the tunable filter 138 to be resonating in accordance with signals corresponding to different, selectable frequency ranges. The tunable filter 138 provides a plus input voltage (Vin+) signal and a minus input voltage (Vin−) signal to the driver amplifier 134.

Each physical or circuit component can include at least one input and at least one output. In operation, a component accepts an incoming signal via the input of the component and provides or forwards an outgoing signal via the output of the component. As illustrated in FIG. 4, signal propagation generally flows from left-to-right and/or from bottom-to-top. Thus, the upconverter 136, the tunable filter 138, and the driver amplifier 134 each include a respective input and output. The input of the upconverter 136 can be coupled to a component that processes a signal at a lower frequency, such as a BBF. The output of the upconverter 136 is coupled to the input of the tunable filter 138. The output of the tunable filter 138 is coupled to the input of the driver amplifier 134. The driver amplifier 134 can include a first output and a second output. The first output of the driver amplifier 134 is coupled to the first balun 306-1, and the second output of the driver amplifier 134 is coupled to the second balun 306-2.

In some implementations, the driver amplifier 134 includes at least one main amplifier 402 (or core amplifier 402) and multiple cascode amplifiers 404-1 to 404-2. Although two cascode amplifiers are shown and described herein, the driver amplifier 134 can include more (or fewer) cascode amplifiers—e.g., a respective cascode amplifier 404 per balun 306. In some cases, the main amplifier 402 comprises a multiband component that is part of the multiband section of the transmitter, and the multiple cascode amplifiers 404-1 to 404-2 comprise focused-band components that are part of the focused-band section of the transmitter, as indicated by the thick dashed-line 410. An input of the main amplifier 402 is coupled to the output of the tunable filter 138, and an output of the main amplifier 402 is coupled to respective inputs of respective ones of the multiple cascode amplifiers 404-1 to 404-2. Thus, an input of the first cascode amplifier 404-1 is coupled to the output of the main amplifier 402, and an output of the first cascode amplifier 404-1 (which also corresponds to the first output of the driver amplifier 134) is coupled to an input of the first balun 306-1. Further, an input of the second cascode amplifier 404-2 is coupled to the output of the main amplifier 402, and an output of the second cascode amplifier 404-2 (which also corresponds to the second output of the driver amplifier 134) is coupled to an input of the second balun 306-2. The respective outputs of respective ones of the multiple baluns 306-1 to 306-2 are coupled directly or indirectly to respective antennas, at least one common or shared antenna, or another antenna arrangement. If at least one other amplifier is coupled between each respective balun 306 of the multiple baluns 306-1 to 306-2 and a respective antenna, a respective power amplifier (e.g., a power amplifier 254 of FIG. 2) can further amplify the signal prior to emanation from the respective antenna.

In operation, the main amplifier 402 accepts the plus input voltage (Vin+) signal and the minus input voltage (Vin−) signal from the tunable filter 138. After amplification, the main amplifier 402 provides an intermediate amplified (IA) signal (or intermediate signal) to each cascode amplifier 404. The intermediate amplified (IA) signal can include a plus IA (IA+) signal and minus IA (IA−) signal. Each cascode amplifier 404 may receive both the plus and the minus IA (IA+ and IA−) signals. Further, each respective cascode amplifier 404 may be tuned for at least one respective frequency band corresponding to that of the respective balun 306 to which the cascode amplifier 404 is coupled. Each cascode amplifier 404 of the multiple cascode amplifiers 404-1 to 404-2 amplifies the intermediate amplified signal (or intermediate signal) to produce a respective amplified differential output signal: a plus output voltage (Vout+) signal and a minus output voltage (Vout−) signal. Each respective cascode amplifier 404 of the multiple cascode amplifiers 404-1 to 404-2 provides a respective amplified differential signal to a respective balun 306 of the multiple baluns 306-1 to 306-2.

Figure 5:
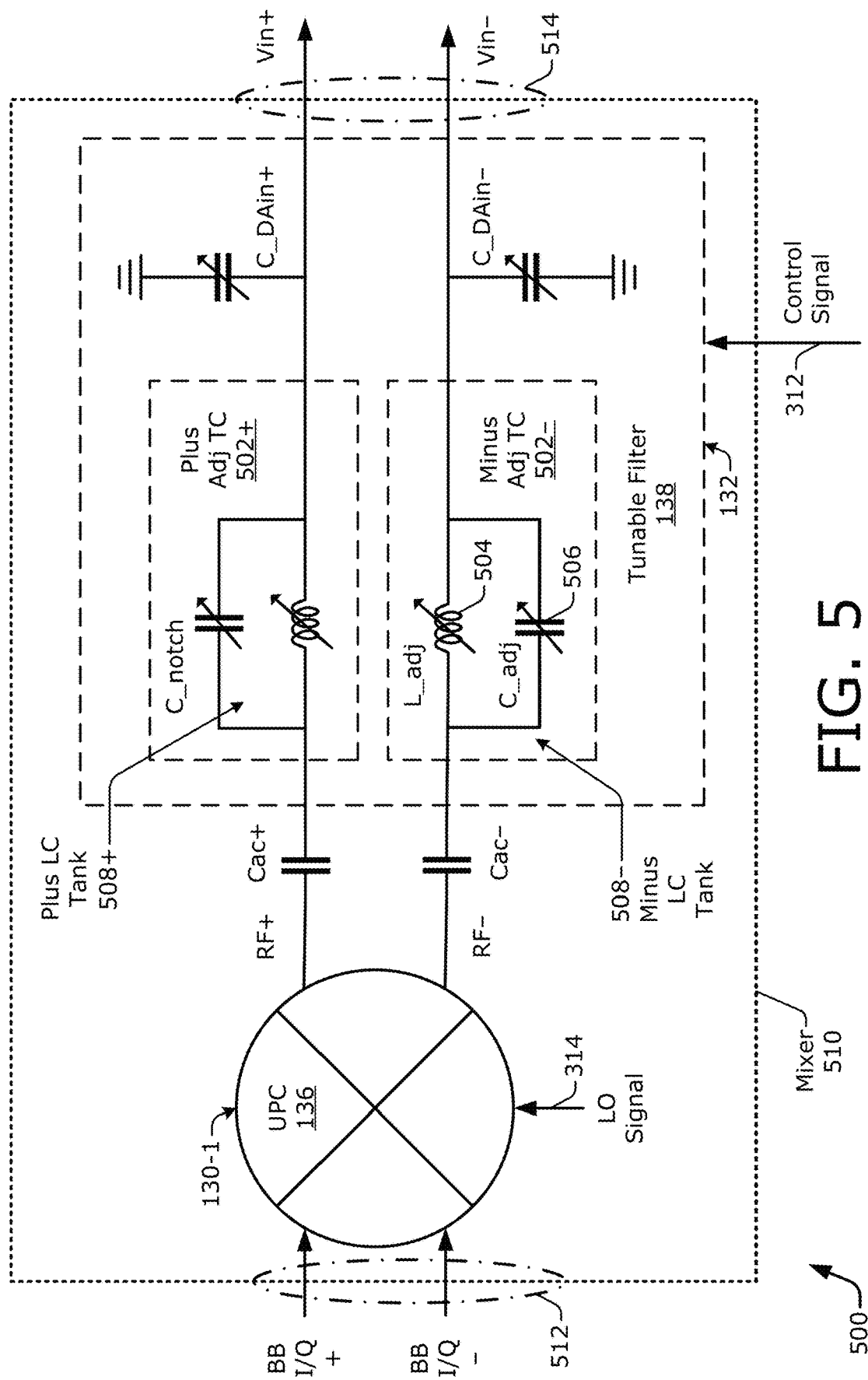
FIG. 5 illustrates an example upconverter and an example tunable filter, which includes example adjustable transition circuitry.

FIG. 5 illustrates, generally at 500, an example upconverter 136 implementation of the mixer 130-1 and an implementation of the mixer load 132 that includes an example tunable filter 138. The tunable filter 138 includes example adjustable transition circuitry 502 (Adj TC 502). For a differential implementation, the tunable filter 138 can include plus adjustable transition circuitry 502+ and minus adjustable transition circuitry 502−. Each adjustable transition circuitry 502 comprises an LC tank 508. Thus, the tunable filter 138 can include a plus LC tank 508+ and a minus LC tank 508−.

In example implementations, each LC tank 508 includes an adjustable inductor 504 (L_adj) and a capacitor 506. The capacitor of the LC tank 508 can be realized with an adjustable capacitor 506 (C_adj or C_notch). The adjustable inductor 504 can be realized using, for instance, a dual-coil programmable inductor to achieve at least dual-band resonance. The adjustable inductor 504 (L_adj) and the adjustable capacitor 506 (C_adj) can be coupled together in parallel between the output of the upconverter 136 and the input of the driver amplifier 134 (e.g., of FIGS. 3, 4, and 6). Further, in some cases, the inductances and capacitances of the tunable filter 138 can be tuned for tri-band operation using one or more switches. These adjustable components and reactances are described further with reference to FIG. 7.

In alternative implementations, a "mixer," a "mixer assembly," or a "frequency converter" (e.g., a frequency translator or a frequency upconverter (UPC) or frequency downconverter (DNC)) can include both the mixer 130-1/upconverter 136 and the mixer load 132/tunable filter 138 as depicted. For example, a mixer 510, which combines an upconverter 136 and a tunable filter 138 as shown, can include a mixer input 512 (e.g., that corresponds to four signal components BBI+/− and BBQ+/−) and a mixer output 514 (e.g., that corresponds to two signal components Vin+ and Vin−). In such implementations, the RF+ and RF− nodes or signaling pathways may comprise an intra-mixer interface of the mixer 510, with the nodes or signaling pathways being electrically coupled between the upconverter 136 and the tunable filter 138.

As shown in FIG. 5, a wireless interface device can also include at least one alternating-current (AC)-coupling capacitor (Cac), such as a plus AC-coupling capacitor (Cac+) and a minus AC-coupling capacitor (Cac−). The AC-coupling capacitor is coupled between the output of the upconverter 136 and the input of the tunable filter 138. A wireless interface device can further include at least one impedance-matching capacitor (C_DAin) to match an impedance of the input of the driver amplifier 134 (e.g., of FIGS. 3, 4, and 6). In a differential environment, the circuitry can include a plus impedance-matching capacitor (C_DAin+) and a minus impedance-matching capacitor (C_DAin−). Generally, each circuit component can include at least two terminals, such as a first terminal and a second terminal. The impedance-matching capacitor (C_DAin) is coupled between (i) a ground node via a first terminal and (ii) via a second terminal between the output of the tunable filter 138 and the input of the driver amplifier 134. The impedance-matching capacitor (C_DAin) can be adjustable to accommodate multiple frequency ranges. Both the AC-coupling capacitor (Cac) and the impedance-matching capacitor (C_DAin) may be implemented as a plus component and a minus component thereof for differential architectures.

In some environments, the adjustable inductor 504 provides a series inductor as part of a matching network between an output the upconverter 136 and an input of the driver amplifier 134. The tunable filter 138 can therefore provide a low impedance for the output of the upconverter 136 at a frequency of the LO signal 314 (f_lo). With a current-mode passive mixer, by way of example, the smaller swings at the drain of the mixer result in higher linearity. A passive mixer, however, is unlikely to properly drive a large capacitor of the driver amplifier at relatively higher frequencies, such as 5 GHz. Including the adjustable capacitor 506 (C_adj) provides increased resonance. The adjustable inductor 504 and the adjustable capacitor 506 can be tuned to jointly resonate at, for instance, 3*f_lo. Further, the adjustable inductor 504 in conjunction with a combination of the adjustable capacitor 506 and the impedance-matching capacitor (C_DAin) can be tuned to resonate at f_lo. With example implementations having a passive mixer, a 4*f_lo blocker may be omitted because the passive mixer does not generate a 4*f_lo tone. The 3*f_lo trapping, on the other hand, can be embedded within the adjustable inductor 504.

FIG. 6 illustrates, generally at 600, an example driver amplifier 134 (e.g., of FIG. 4) and multiple baluns 306-1 to 306-2. The driver amplifier 134 includes the main amplifier 402 and the multiple cascode amplifiers 404-1 to 404-2. In example implementations, the main amplifier 402 includes multiple plus transistors 602+ and multiple minus transistors 602−. Each of the transistors 602 can be coupled between at least one cascode amplifier 404 and a ground node. Each of the transistors 602 can be implemented as a transconductance amplifier (e.g., a Gm device) in a common-source configuration. Each transistor can include multiple terminals, such as two channel terminals and a gate terminal. The channel terminals can include a source terminal and a drain terminal for field-effect transistor (FET) implementations. Described circuitry can, however, be implemented with different types of transistors. The input of the main amplifier 402 corresponds to the gate terminals of the multiple transistors 602; therefore, these gate terminals are coupled to the plus and minus input voltage (Vin+ and Vin−) signals. A quantity of transistors 602 for each of the plus and minus parts of the signaling paths can be determined based on a quantity of bits in the control signal 312, which is described below.

In example implementations, each cascode amplifier 404 includes multiple transistors 604. The first cascode amplifier 404-1 includes first plus transistors 604-1+ and first minus transistors 604-1−. The second cascode amplifier 404-2 includes second plus transistors 604-2+ and second minus transistors 604-2−. Each of these transistors is implemented as at least part of a cascode amplifier with respect to at least one transistor 602 of the main amplifier 402. Each cascode transistor 604 is implemented in common-gate configuration. To control amplification, each gate terminal of each cascode transistor 604 is coupled to a respective bit of the control signal 312 to turn the respective cascode transistor 604 on or off. This is indicated by the plus and minus cascode control voltages (Vcasc+/−<7:0>). Although an example size of the control signal 312 includes eight bits, the control signal 312 may have more or fewer bits. The source terminal of each cascode transistor 604 is coupled to a drain terminal of a transistor 602 of the main amplifier 402. The drain terminal of each cascode transistor 604 is coupled to an inductor that comprises part of a transformer of a balun 306.

As a specific example, a given plus transistor 602+ is coupled to a respective first plus transistor 604-1+ and a respective second plus transistor 604-2+. Similarly, a given minus transistor 602− is coupled to a respective first minus transistor 604-1− and a respective second minus transistor 604-2−. Each transistor in both amplifier sections or stages is shown as a field-effect transistor (FET). However, transistors can be implemented differently, such as by using junction FETs (JFETs) or bipolar junction transistors (BJTs). Each FET includes a gate terminal and two channel terminals: a source terminal and a drain terminal. Each illustrated FET is an n-type FET. However, the FETs can instead be implemented using p-type FETs, such as by swapping the supply voltage (Vdd) node (not shown) and the ground node.

Each transistor for a set of transistors can be replicated a given quantity of times depending on a desired granularity of different amplification levels. An example of eight instances per transistor set is depicted in FIG. 6 (e.g., for 256 different amplification levels), but other quantities can be used instead (e.g., 4 or 16 transistors per set). Further, these transistors can be weighted, such as by using binary or thermometer coding.

For the input of the first balun 306-1, for instance, a first terminal can accept the plus output voltage (Vout+) from those first plus transistors 604-1+ that are turned on by the control signal 312. A second terminal of the first balun 306-1 can accept the minus output voltage (Vout−) from those first minus transistors 604-1− that are turned on by the control signal 312. Each respective balun 306 can have a reactive value (e.g., an inductive value) based on the corresponding frequency range 308 (e.g., of FIGS. 3 and 4). Although not shown, each balun 306 can include an adjustable capacitor coupled in parallel with the inductor thereof that is electrically connected to the corresponding cascode amplifier 404. The capacitance of this adjustable capacitor can be changed based on which frequency or frequency range is being propagated through the driver amplifier 134 and corresponding balun 306 (e.g., the second or third frequency range 308-2a or 308-2b for the second cascode amplifier 404-2 and the second balun 306-2).

Figure 7:
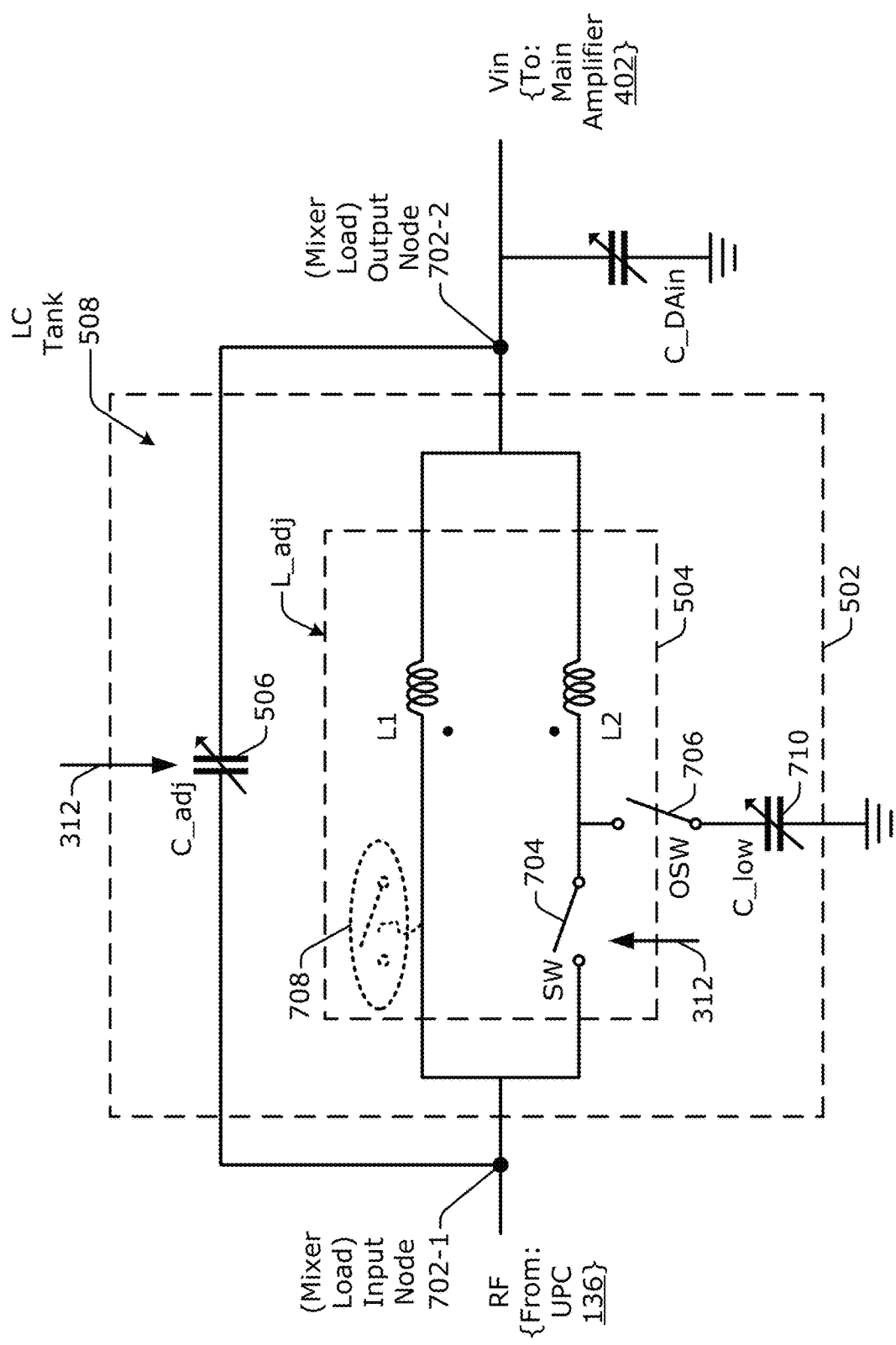
FIG. 7 illustrates an example of adjustable transition circuitry of a tunable filter that includes at least one inductive-capacitive (LC) tank.

FIG. 7 illustrates, generally at 700, an example of an LC tank 508, or adjustable transition circuitry 502, of a tunable filter 138 implementation of a mixer load 132 (e.g., both of FIG. 5). As shown, the LC tank 508 includes the adjustable capacitor 506 (C_adj) and the adjustable inductor 504 (L_adj). These components are coupled between an input node 702-1 (of a mixer load 132) and an output node 702-2 (of the mixer load 132). The adjustable capacitor 506 (C_adj) is coupled between the input node 702-1 and the output node 702-2. The input node 702-1 is coupled to the output of the upconverter 136 (e.g., via a coupling capacitor Cac), and the output node 702-2 is coupled to the input of the main amplifier 402 of the driver amplifier 134. The adjustable inductor 504 (L_adj) is also coupled between the input node 702-1 and the output node 702-2. Thus, the adjustable capacitor 506 (C_adj) and the adjustable inductor 504 (L_adj) can be coupled in parallel with each other. The LC tank 508 can also include one or more switches. The one or more switches depicted in FIG. 7 or described herein can be placed at AC ground or DC ground.

In example implementations, the adjustable inductor 504 includes multiple inductors and at least one switch. As shown, the adjustable inductor 504 includes a first inductor L1, a second inductor L2, and a switch 704 (SW). The second inductor L2 is coupled in series with the switch 704 to establish or form a series connection. This series connection is coupled in parallel with the first inductor L1 between the input node 702-1 and the output node 702-2. In some cases, the second inductor L2 is smaller than the first inductor L1. For example, an inductance of the first inductor L1 can be approximately 2.5 times greater than an inductance of the second inductor L2. With the example two (2), five (5), and six (6) GHz scenario described above, the second frequency range 308-2, which corresponds to or is enabled by the second inductor L2, covers 4.9-7.2 GHz. This frequency range is approximately 2×-3× the 2.4 GHz frequency of the first frequency range 308-1. Alternatively, the second inductor L2 can be considered to correspond to two frequency ranges: a second frequency range 308-2a at 4.9-6 GHz and a third frequency range 308-2b at 6-7.2 GHz.

In example operations, the switch 704 (SW) is open for the first frequency range 308-1, which is lower than the second frequency range 308-2. With the switch 704 being in an open state, a propagating RF signal flows through the first inductor L1 (and the adjustable capacitor 506 (C_adj)). In contrast, the switch 704 is therefore closed to process signals in the second frequency range 308-2. Responsive to the switch 704 being in a closed state, a propagating RF signal flows through the first inductor L1 and the second inductor L2 (and the adjustable capacitor 506 (C_adj)). Accordingly, the propagating signal is processed based on a parallel combination of the inductances of the first and second inductors L1 and L2 with the switch 704 closed. The open or closed state of the switch 704 can be controlled by the control signal 312 based on the intended frequency of the transmission signal or the frequency of the LO signal 314 (e.g., of FIGS. 3-5). The capacitance of the adjustable capacitor 506 (C_adj) can also be controlled by the control signal 312 based on a present mode 310 and corresponding respective frequency range 308.

In alternative implementations, an additional switch 708 (as depicted with dashed lines) can be disposed or coupled in series with the first inductor L1 to enable both inductors to be open-circuited. This additional switch 708 can then be closed for the first frequency range 308-1 and opened for the second frequency range 308-2. In such alternative implementations, the inductances need not be combined to support two modes or frequency ranges. Instead, an inductance of the first inductor L1 can be established based on a first frequency range 308-1, and an inductance of the second inductor L2 can be established based on a second frequency range 308-2. Thus, a third frequency range can be supported based on a combination of the first and second inductors L1 and L2. If two switches 704 and 708 are present, the use of each switch individually or jointly with the other may be established in any manner to support a desired set of frequency ranges. In still other alternative implementations, the adjustable inductor 504 can be realized using multiple inductors that are coupled together in series. In operation individual inductor(s) may be selectively shorted using at least one switch to change the inductance of the adjustable inductor 504.

In some implementations, another adjustable capacitor 710 (C_low) is coupled between a ground node and a node positioned electrically between the second inductor L2 and the switch 704 (SW). In other words, the other adjustable capacitor 710 (C_low) can be coupled via a first terminal to a ground node and can be coupled via a second terminal between the switch 704 and the second inductor L2. The other adjustable capacitor 710 (C_low) may be switchably coupled to the adjustable inductor 504 (L_adj). For example, using an other switch 706 (OSW), a capacitor that is designed for relatively lower-frequencies can be decoupled for the second frequency range 308-2 that uses at least the second inductor L2 (and may also use the first inductor L1) as a series inductance for signal propagation. In contrast, for the first, lower frequency range 308-1, the lower-frequency capacitor 710 (C_low) is coupled to the second inductor L2 via the other switch 706 (e.g., the switch 706 is closed) to create a shunt notch. This higher frequency notch can be generated using the second inductor L2 and the other adjustable capacitor 710 (C_low). Thus, this higher-frequency notch can be generated for the first frequency range 308-1 that uses the first inductor L1 (but not the second inductor L2) as a series inductance for RF signal propagation through the LC tank 508.

The depicted capacitors can range between 0 and 1 picofarad (pF) as one example adjustable range for purposes of illustration only. The k value representing the magnetic coupling between the first and second inductors L1 and L2 can be approximately 0.07, but other values may be employed instead. The input node 702-1 can be configured as an AC ground in some implementations. Further, the capacitor 506 may instead be implemented with a fixed or non-adjustable capacitor, such as if the first and second frequency ranges are relatively closer together or have narrower ranges.

Figures 1, 8:
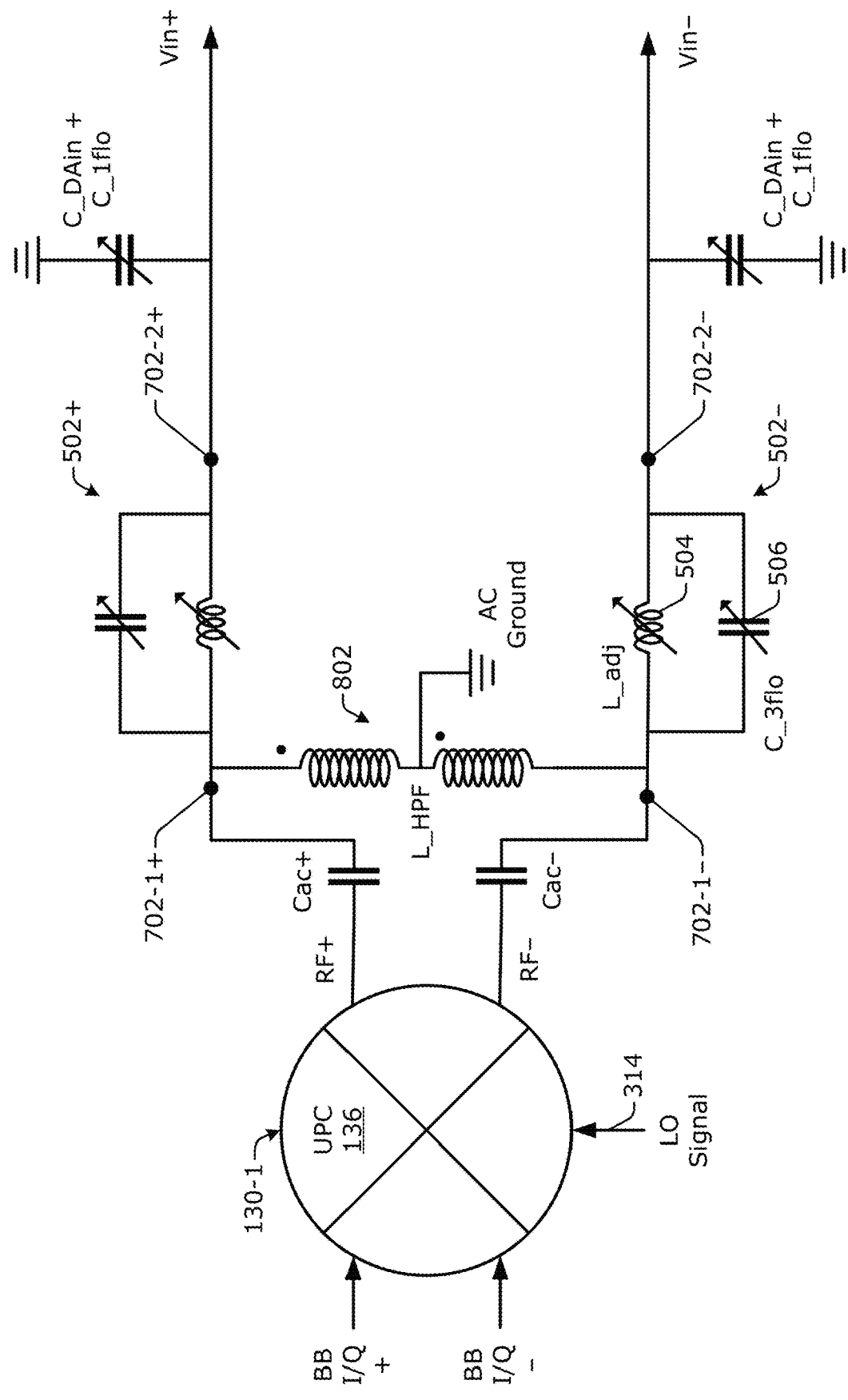
Figures 2, 8:
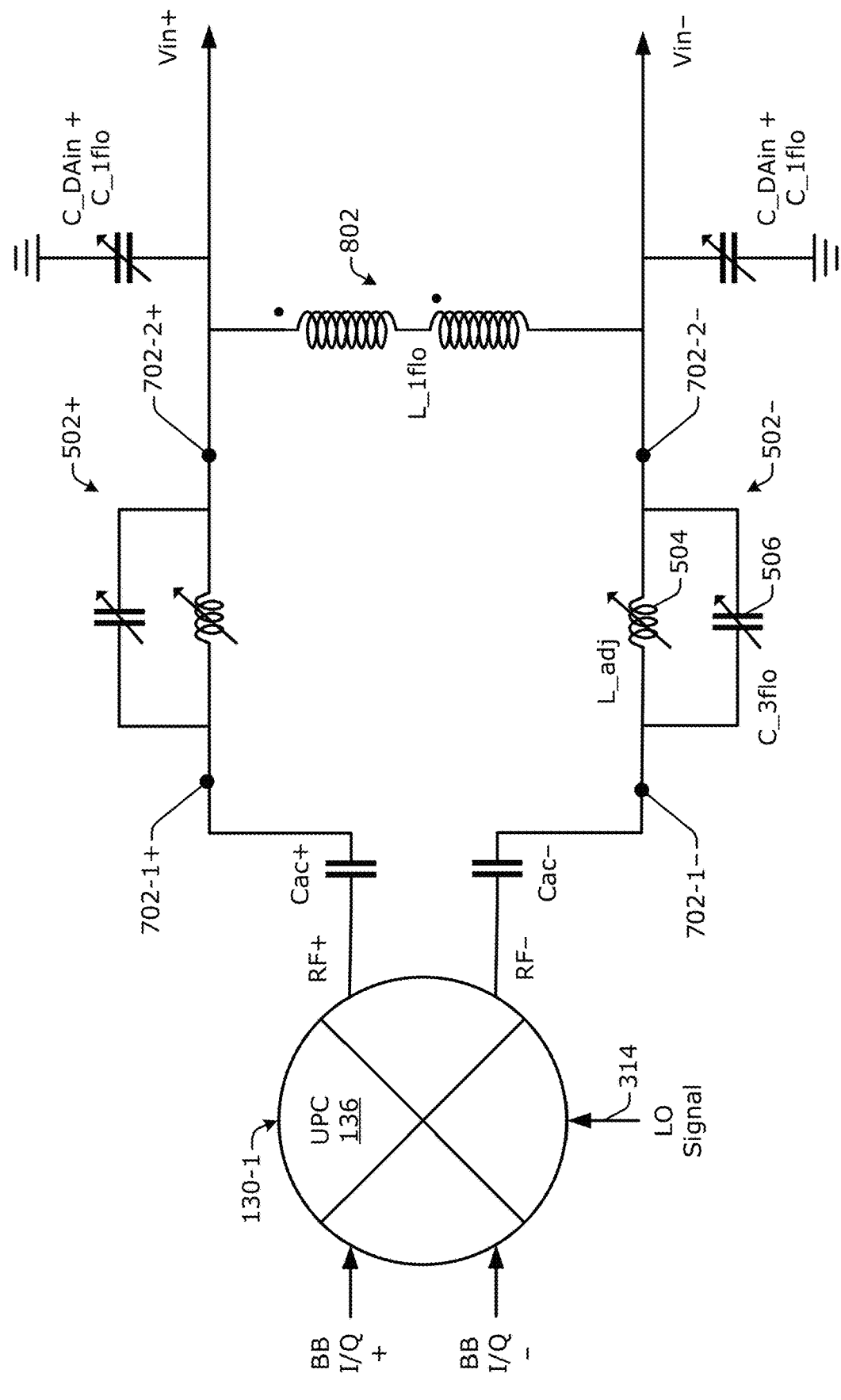
Figures 3, 8:
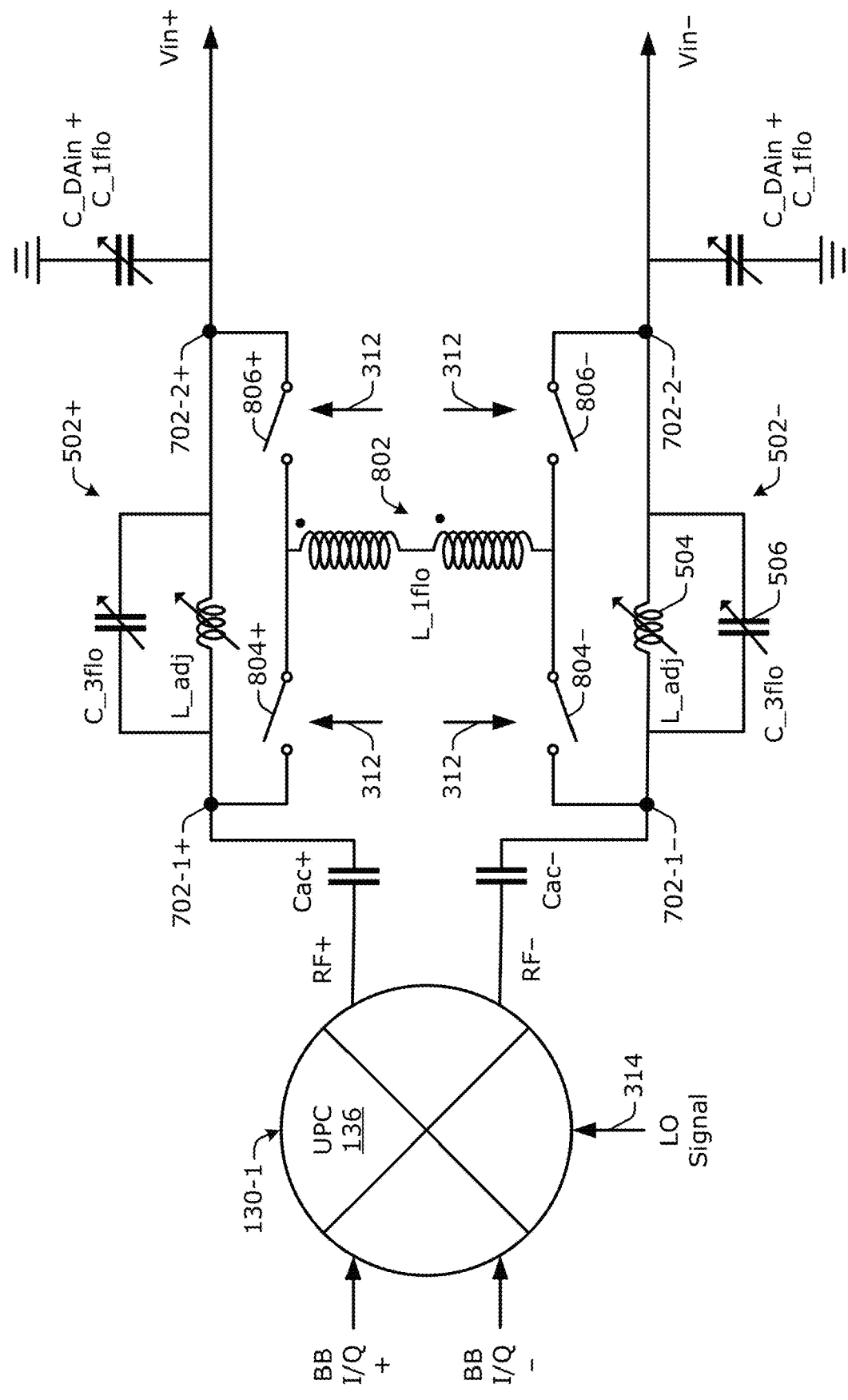

FIGS. 8-1 to 8-3 illustrate example implementations of a mixer 130-1, which is implemented as an upconverter 136, and mixer load 132 combination that includes a shunt inductor 802 coupled between plus and minus parts of the differential circuitry. Thus, a differential inductor 802 can be shunted across the plus and minus LC tanks 508+ and 508− (of FIG. 5) at different nodes for different purposes, as is described next. In FIG. 8-1, the shunt inductor 802 (or differential inductor 802) is coupled between a plus input node 702-1+ and a minus input node 702-1− at 800-1. The shunt inductor 802 operates as a high-pass filter (HPF) with these connections. By incorporating an additional HPF after the upconverter 136, the HPF can reject the second-order nonlinearity—e.g., the upconverted (f_LO+f_JAM2−f_JAM1) and 2H generated at the output of the upconverter 136. A low-Q inductive high-pass filter (L HPF) will not cause appreciable performance degradation, and thus an area-efficient inductor can be implemented. It should be appreciated that the circuits 502+ and 502− of FIGS. 8-1, 8-2, and 8-3 (which circuits 502 are also depicted in FIG. 5) may be implemented by the examples of the LC tank 508 that are shown in FIG. 7.

In FIG. 8-2, the shunt inductor 802 (or differential inductor 802) is coupled between a plus output node 702-2+ and a minus output node 702-2− at 800-2. If the impedance-matching capacitor (C_DAin) would be too large (e.g., larger than desired or feasible in a given architecture) at high frequency due to the size of the input transistor 602 of the main amplifier 402 (both of FIG. 6) of the driver amplifier 134, incorporating a differential inductor 802 at the output of the tunable filter 138 implementation of the mixer load 132 can "resonance out" some of the capacitance. Thus, the shunt inductor 802 as coupled in FIG. 8-2 can enable use of a smaller impedance-matching capacitor (C_DAin).

In FIG. 8-3 at 800-3, the shunt inductor 802 is switchably coupled between the plus input node 702-1+ and the minus input node 702-1− (e.g., like in FIG. 8-1) and switchably coupled between the plus output node 702-2+ and the minus output node 702-2− (e.g., like in FIG. 8-2). The shunt inductor 802 can therefore be selectively engaged as a HPF at the input of the tunable filter 138 by closing the plus and minus switches 804+ and 804− (and opening the plus and minus switches 806+ and 806−). The shunt inductor 802 can instead be selectively engaged as a capacitance compensator at the output of the tunable filter 138 by closing the plus and minus switches 806+ and 806− (and opening the plus and minus switches 804+ and 804−). Because inductors are relatively large components and it may be infeasible to deploy a shunt inductor 802 at both locations, this switching arrangement 800-3 enables the shunt inductor 802 to be selectively coupled to the mixer load at the node(s) that can provide higher performance in a given mode. Thus, this approach that shares the shunt inductor 802 in a timedivision manner can selectively achieve one of both purposes with a reduced area and cost.

Figure 9:
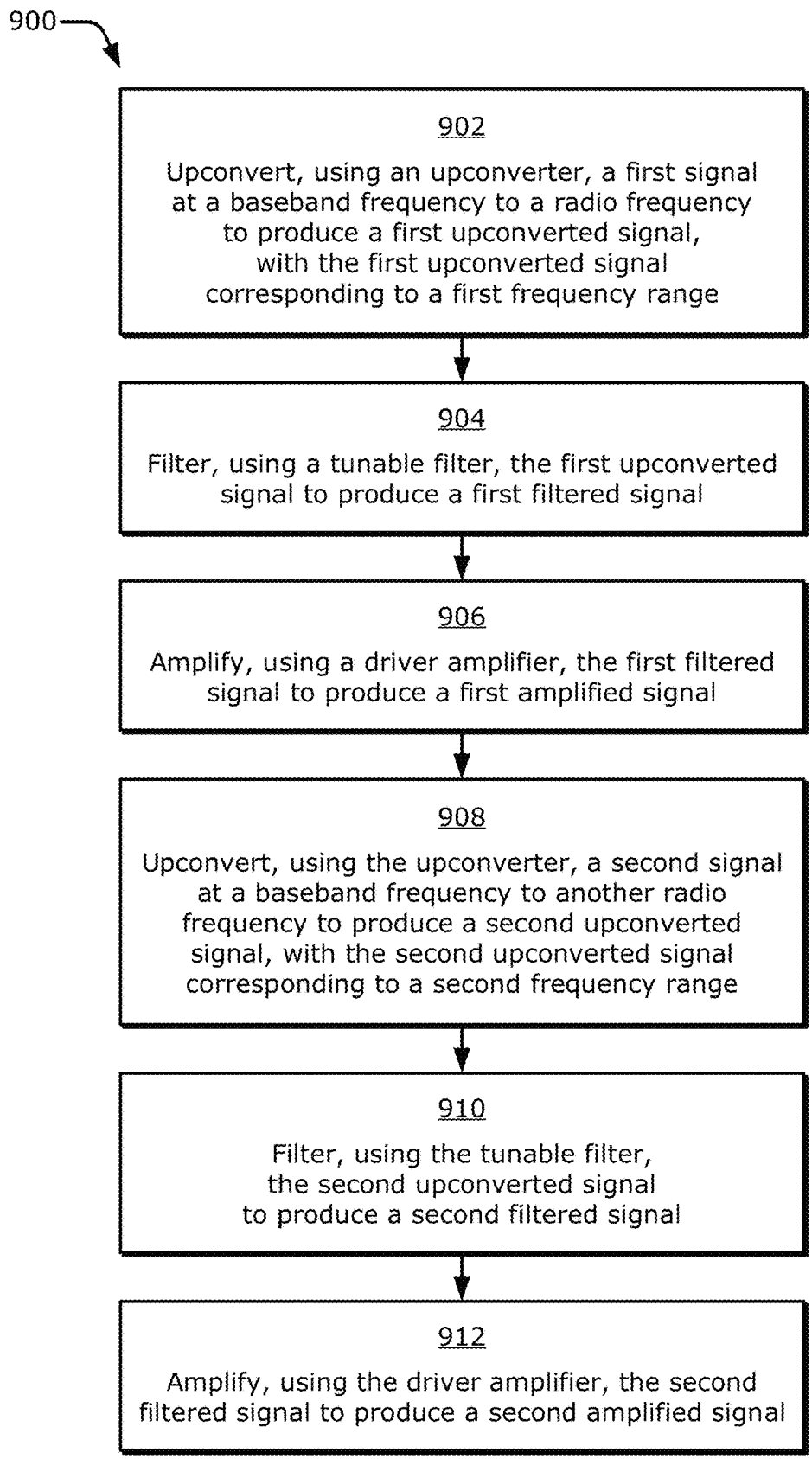
FIG. 9 is a flow diagram illustrating an example process for operating a multiband transmitter to process signals for wireless transmission.

FIG. 9 is a flow diagram illustrating an example process 900 for operating a multiband transmitter to process signals for wireless transmission. The process 900 is described in the form of a set of blocks 902-912 that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the process 900, or an alternative process. Operations represented by the illustrated blocks of the process 900 may be performed, for instance, by a wireless interface device 120 or a portion thereof.

At block 902, using an upconverter, a first signal at a baseband frequency is upconverted to a radio frequency to produce a first upconverted signal, with the first upconverted signal corresponding to a first frequency range. For example, an upconverter 136 can upconvert a first signal BB+/− at a baseband frequency (BBF) "directly" (e.g., bypassing an IF) to a radio frequency (RF) to produce a first upconverted signal RF+/−. In this case, the first upconverted signal RF+/− corresponds to a first frequency range 308-1. The first frequency range 308-1 may be implemented with, for instance, a 2 GHz or 2.4 GHz WLAN band with channels around 2.4 GHz. Components that process a signal after the upconverting can provide better performance if such components are configured to condition signals at the selected radio frequency.

At block 904, using a tunable filter, the first upconverted signal is filtered to produce a first filtered signal. For example, a tunable filter 138 can filter the first upconverted signal RF+/− to produce a first filtered signal. To do so, the tunable filter 138 may propagate the first upconverted signal RF+/− through an LC tank 508 including an adjustable capacitor 506 (C_adj) and an adjustable inductor 504 (L_adj) to produce the first filtered signal having a voltage basis Vin+/−. The tunable filter 138 can form at least a part of a load of the upconverter 136.

At block 906, using a driver amplifier, the first filtered signal is amplified to produce a first amplified signal. For example, a driver amplifier 134 can amplify the first filtered signal Vin+/− to produce a first amplified signal. The driver amplifier 134 can accommodate signals having different frequency ranges and may include different sections. For instance, a shared multiband main amplifier 402 may amplify the first filtered signal Vin+/− to produce an intermediate signal IA+/−. A split-band or focused-band section may be realized with multiple cascode amplifiers 404-1 to 404-2 with a selected cascode amplifier 404, such as a first cascode amplifier 404-1, amplifying the intermediate signal IA+/− to produce the first amplified signal Vout+/−.

As described above relative to blocks 902-906, a first signal corresponding to a first frequency range can be generated or otherwise processed by three components: the upconverter 136, the tunable filter 138, and the driver amplifier 134. As described below relative to blocks 908-912, the same three components can generate or otherwise process a second signal corresponding to a second frequency range before or after handling the first signal at the first frequency range. At block 908, using the upconverter, a second signal at a baseband frequency is upconverted to another radio frequency to produce a second upconverted signal, with the second upconverted signal corresponding to a second frequency range. For example, the upconverter 136 can upconvert a second signal BB+/− at a baseband frequency (BBF) "directly" to another radio frequency (RF) to produce a second upconverted signal RF+/−. In this case, the second upconverted signal RF+/− corresponds to a second frequency range 308-2. Here, the second frequency range 308-2 may be implemented with, for instance, a 5 GHz and/or a 6 GHz WLAN band with channels around 4.9-6 GHz and/or 6-7.2 GHz, respectively.

At block 910, using the tunable filter, the second upconverted signal is filtered to produce a second filtered signal. For example, the tunable filter 138 can filter the second upconverted signal RF+/− to produce a second filtered signal Vin+/−. This filtering may include routing the second upconverted signal RF+/− through at least one of two inductors that are coupled together in parallel. Thus, the tunable filter 138, based on a state of a switch 704 (SW), may propagate the second upconverted signal RF+/− through a series-connected first inductor L1 or a series-connected second inductor L2 (e.g., one or both inductors) to produce the second filtered, voltage-based signal Vin+/−. The first and second inductors L1 and L2 may be series-connected relative to the flow of the propagating signal being processed.

At block 912, using the driver amplifier, the second filtered signal is amplified to produce a second amplified signal. For example, the driver amplifier 134 can amplify the second filtered signal Vin+/− to produce a second amplified signal Vout+/−. This amplification may be performed, in part, by a second cascode amplifier 404-2 that corresponds to the second frequency range 308-2. The second cascode amplifier 404-2 can provide the second amplified signal Vout+/− to a second balun 306-2 that includes at least one component corresponding to the second frequency range 308-2.

Some aspects are described below.

Aspect 1: An apparatus for processing signals for wireless transmission, the apparatus comprising:
  a wireless interface device comprising:
    an upconverter having an output, the upconverter configured to upconvert a baseband frequency to a radio frequency based on a local oscillator signal;
    a tunable filter having an input and an output, the input of the tunable filter coupled to the output of the upconverter; and
    a driver amplifier having an input, the input of the driver amplifier coupled to the output of the tunable filter.

Aspect 2: The apparatus of aspect 1, wherein:
  the tunable filter is configured to filter a first signal in a first frequency range and a second signal in a second frequency range, the first frequency range noncontiguous with the second frequency range.

Aspect 3: The apparatus of aspect 1 or 2, wherein the tunable filter is configured to:
  filter the first signal in the first frequency range using at least one first inductor; and
  filter the second signal in the second frequency range using at least one second inductor.

Aspect 4: The apparatus of any of the preceding aspects, wherein:
  the upconverter comprises a direct-conversion upconverter configured to translate signals from the baseband frequency directly to the radio frequency.

Aspect 5: The apparatus of any of the preceding aspects, further comprising:
  a power amplifier having an input and an output, the input of the power amplifier coupled to an output of the driver amplifier; and at least one antenna having an input, the input of the at least one antenna coupled to the output of the power amplifier.

Aspect 6: The apparatus of any of the preceding aspects, wherein the tunable filter is configured to:

tune one or more components based on a first frequency range corresponding to a 2.4 GHz band of a wireless local area network (WLAN); and tune the one or more components based on a second frequency range corresponding to a 4.9-6 GHz band of the WLAN.

Aspect 7: The apparatus of any of the preceding aspects, wherein:

the tunable filter comprises an adjustable inductor and a capacitor; and the adjustable inductor and the capacitor are coupled together in parallel.

Aspect 8: The apparatus of any of the preceding aspects, wherein the adjustable inductor comprises:

multiple inductors; and a switch coupled to at least one of the multiple inductors.

Aspect 9: The apparatus of any of the preceding aspects, wherein:

the multiple inductors comprise a first inductor and a second inductor;

the second inductor is coupled in series with the switch to form a series connection between the input and the output of the tunable filter; and the first inductor is coupled between the input and the output of the tunable filter and in parallel with the series connection of the second inductor and the switch.

Aspect 10: The apparatus of any of the preceding aspects, wherein:

the tunable filter comprises at least part of a load for the upconverter, the tunable filter configured to propagate signals corresponding to a first frequency range and a second frequency range; and the switch is configured to be:

in an open state for the first frequency range; and in a closed state for the second frequency range.

Aspect 11: The apparatus of any of the preceding aspects, wherein the second frequency range is higher than the first frequency range.

Aspect 12: The apparatus of any of the preceding aspects, wherein:

the tunable filter comprises an adjustable capacitor having a first terminal and a second terminal, the first terminal coupled between the second inductor and the switch, the second terminal coupled to a ground node.

Aspect 13: The apparatus of any of the preceding aspects, wherein:

the capacitor comprises an adjustable capacitor;

the adjustable inductor and the adjustable capacitor are coupled together in parallel between the output of the upconverter and the input of the driver amplifier;

and an inductance of the first inductor is approximately 2.5 times greater than an inductance of the second inductor.

Aspect 14: The apparatus of any of the preceding aspects, wherein the tunable filter comprises at least part of a load of the upconverter.

Aspect 15: The apparatus of any of the preceding aspects, wherein:

the tunable filter comprises:

a plus LC tank; and a minus LC tank; and the wireless interface device comprises an inductor shunted across the plus LC tank and the minus LC tank.

Aspect 16: The apparatus of any of the preceding aspects, wherein the inductor is coupled between the output of the upconverter and the input of the tunable filter.

Aspect 17: The apparatus of any of the preceding aspects, wherein the inductor is coupled between the output of the tunable filter and the input of the driver amplifier.

Aspect 18: The apparatus of any of the preceding aspects, wherein the inductor is switchably coupled:

between the output of the upconverter and the input of the tunable filter; and between the output of the tunable filter and the input of the driver amplifier.

Aspect 19: The apparatus of any of the preceding aspects, wherein the tunable filter comprises:

an adjustable capacitor having a first terminal and a second terminal, the first terminal coupled between the plus LC tank and the input of the driver amplifier, the second terminal coupled to a ground node.

Aspect 20: The apparatus of any of the preceding aspects, wherein:

the driver amplifier comprises a first output and a second output, the first output corresponding to a first frequency range and the second output corresponding to a second frequency range; and the input of the driver amplifier corresponds to the first frequency range and the second frequency range.

Aspect 21: The apparatus of any of the preceding aspects, wherein the driver amplifier comprises:

a main amplifier coupled to the input of the driver amplifier, the main amplifier corresponding to the first frequency range and the second frequency range; and multiple cascode amplifiers comprising a first cascode amplifier and a second cascode amplifier, the first cascode amplifier coupled between the main amplifier and the first output and corresponding to the first frequency range, the second cascode amplifier coupled between the main amplifier and the second output and corresponding to the second frequency range.

Aspect 22: The apparatus of any of the preceding aspects, wherein the wireless interface device comprises:

a first balun coupled to the first output and corresponding to the first frequency range; and a second balun coupled to the second output and corresponding to the second frequency range.

Aspect 23: The apparatus of any of the preceding aspects, wherein:

the upconverter corresponds to the first frequency range, the second frequency range, and a third frequency range;

the main amplifier corresponds to the first frequency range, the second frequency range, and the third frequency range;

the second cascode amplifier corresponds to the second frequency range and the third frequency range; and the tunable filter is configured to selectively correspond to:

the first frequency range for a first mode; and the second frequency range and the third frequency range for a second mode.

Aspect 24: An apparatus for processing signals for wireless transmission, the apparatus comprising:

means for upconverting signals at one or more baseband frequencies to two or more radio frequencies to produce upconverted signals, the upconverted signals corresponding a first frequency range and a second frequency range;

means for filtering the upconverted signals to produce filtered signals, the filtered signals corresponding to the first frequency range and the second frequency range; and means for amplifying the filtered signals to produce amplified signals, the amplified signals corresponding to the first frequency range and the second frequency range.

Aspect 25: The apparatus of aspect 24, wherein the means for filtering comprises:

means for switchably resonating in accordance with the first frequency range and the second frequency range.

Aspect 26: A method for processing signals for wireless transmission, the method comprising:

upconverting, using an upconverter, a first signal at a baseband frequency to a radio frequency to produce a first upconverted signal, the first upconverted signal corresponding to a first frequency range;

filtering, using a tunable filter, the first upconverted signal to produce a first filtered signal;

amplifying, using a driver amplifier, the first filtered signal to produce a first amplified signal;

upconverting, using the upconverter, a second signal at a baseband frequency to another radio frequency to produce a second upconverted signal, the second upconverted signal corresponding to a second frequency range;

filtering, using the tunable filter, the second upconverted signal to produce a second filtered signal; and amplifying, using the driver amplifier, the second filtered signal to produce a second amplified signal.

Aspect 27: The method of aspect 26, wherein the filtering of the first upconverted signal to produce the first filtered signal comprises:

opening a switch of the tunable filter; and routing the first upconverted signal through at least a first inductor of the tunable filter to produce the first filtered signal.

Aspect 28: The method of aspect 26 or 27, wherein the filtering of the second upconverted signal to produce the second filtered signal comprises:

closing the switch of the tunable filter; and responsive to the closing, routing the second upconverted signal through at least a second inductor of the tunable filter to produce the second filtered signal.

Aspect 29: The method of any one of aspects 26-28, wherein the amplifying of the first filtered signal to produce the first amplified signal comprises:

amplifying, using a main amplifier of the driver amplifier, the first filtered signal to produce a first intermediate signal; and amplifying, using a first cascode amplifier of the driver amplifier, the first intermediate signal to produce the first amplified signal.

Aspect 30: The method of any one of aspects 26-29, wherein the amplifying of the second filtered signal to produce the second amplified signal comprises:

amplifying, using the main amplifier of the driver amplifier, the second filtered signal to produce a second intermediate signal; and amplifying, using a second cascode amplifier of the driver amplifier, the second intermediate signal to produce the second amplified signal.

Aspect 31: An apparatus for processing signals for wireless transmission, the apparatus comprising:

a wireless interface device comprising:

an upconverter having a load circuit portion comprising an adjustable inductor in parallel with a capacitor; and a driver amplifier coupled to the upconverter, the driver amplifier comprising:

a multiband section comprising a main amplifier, the main amplifier coupled to an input of the driver amplifier; and a split-band section comprising a first cascode amplifier and a second cascode amplifier, the first cascode amplifier coupled between the main amplifier and a first output of the driver amplifier, the second cascode amplifier coupled between the main amplifier and a second output of the driver amplifier.

Aspect 32: The apparatus of aspect 31, wherein:

the driver amplifier is configured to amplify signals corresponding to a first frequency range and a second frequency range;

the main amplifier is configured to amplify signals corresponding to the first frequency range and the second frequency range;

the first cascode amplifier is configured to amplify signals corresponding to the first frequency range; and the second cascode amplifier is configured to amplify signals corresponding to the second frequency range.

Aspect 33: The apparatus of aspect 31 or 32, wherein the adjustable inductor comprises:

a switch;

a first inductor coupled in parallel with the capacitor; and a second inductor coupled in series with the switch and in parallel with the capacitor.

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first node" or a "first inductor" in one context may be identified as a "second node" or a "second inductor," respectively, in another context. Similarly, a "first frequency range" in one claim may be recited as a "second frequency range" in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for processing signals for wireless transmission, the apparatus comprising:
a wireless interface device comprising:
an upconverter having an output, the upconverter configured to upconvert a baseband frequency to a radio frequency based on a local oscillator signal;
a tunable filter having an input and an output, the input of the tunable filter coupled to the output of the upconverter,
the tunable filter comprising an adjustable inductor and a capacitor that are coupled together in parallel,
the adjustable inductor comprising multiple inductors including a first inductor and a second inductor and a switch coupled to at least one of the multiple inductors, the second inductor coupled in series with the switch to form a series connection between the input and the output of the tunable filter, the first inductor coupled between the input and the output of the tunable filter and in parallel with the series connection of the second inductor and the switch, and
the tunable filter further comprising an adjustable capacitor having a first terminal and a second terminal, the first terminal coupled between the second inductor and the switch, the second terminal coupled to a ground node; and
a driver amplifier having an input, the input of the driver amplifier coupled to the output of the tunable filter.

2. The apparatus of claim 1, wherein:
the tunable filter is configured to filter a first signal in a first frequency range and a second signal in a second frequency range, the first frequency range noncontiguous with the second frequency range.

3. The apparatus of claim 2, wherein the tunable filter is configured to:
filter the first signal in the first frequency range using at least the first inductor; and
filter the second signal in the second frequency range using at least the second inductor.

4. The apparatus of claim 2, wherein:
the upconverter comprises a direct-conversion upconverter configured to translate signals from the baseband frequency directly to the radio frequency.

5. The apparatus of claim 1, further comprising:
a power amplifier having an input and an output, the input of the power amplifier coupled to an output of the driver amplifier; and
at least one antenna having an input, the input of the at least one antenna coupled to the output of the power amplifier.

6. The apparatus of claim 1, wherein the tunable filter is configured to:
tune one or more components based on a first frequency range corresponding to a 2.4 GHz band of a wireless local area network (WLAN); and
tune the one or more components based on a second frequency range corresponding to a 4.9-6 GHz band of the WLAN.

7. The apparatus of claim 1, wherein:
the tunable filter further comprises at least part of a load for the upconverter, the tunable filter configured to propagate signals corresponding to a first frequency range and a second frequency range; and
the switch is configured to be:
in an open state for the first frequency range; and
in a closed state for the second frequency range.

8. The apparatus of claim 7, wherein the second frequency range is higher than the first frequency range.

9. The apparatus of claim 1, wherein:
the driver amplifier has an output; and
the apparatus further comprises at least one balun coupled to the output of the driver amplifier.

10. The apparatus of claim 1, wherein:
the capacitor is another adjustable capacitor;
the adjustable inductor and the other adjustable capacitor are coupled together in parallel between the output of the upconverter and the input of the driver amplifier; and
an inductance of the first inductor is approximately 2.5 times greater than an inductance of the second inductor.

11. The apparatus of claim 1, wherein the tunable filter further comprises at least part of a load of the upconverter.

12. The apparatus of claim 1, wherein:
the tunable filter further comprises:
a plus inductive-capacitive (LC) tank; and
a minus LC tank;
the plus LC tank includes at least the adjustable inductor and the capacitor; and
the wireless interface device further comprises an inductor shunted across the plus LC tank and the minus LC tank.

13. The apparatus of claim 12, wherein the inductor is coupled between the output of the upconverter and the input of the tunable filter.

14. The apparatus of claim 12, wherein the inductor is coupled between the output of the tunable filter and the input of the driver amplifier.

15. The apparatus of claim 12, wherein the inductor is switchably coupled:
between the output of the upconverter and the input of the tunable filter; and
between the output of the tunable filter and the input of the driver amplifier.

16. The apparatus of claim 12, wherein the tunable filter further comprises:
another adjustable capacitor having a first terminal and a second terminal, the first terminal coupled between the plus LC tank and the input of the driver amplifier, the second terminal coupled to a ground node.

17. The apparatus of claim 1, wherein:
the driver amplifier comprises a first output and a second output, the first output corresponding to a first frequency range and the second output corresponding to a second frequency range; and
the input of the driver amplifier corresponds to the first frequency range and the second frequency range.

18. The apparatus of claim 17, wherein the driver amplifier further comprises:
a main amplifier coupled to the input of the driver amplifier, the main amplifier corresponding to the first frequency range and the second frequency range; and
multiple cascode amplifiers comprising a first cascode amplifier and a second cascode amplifier, the first cascode amplifier coupled between the main amplifier and the first output and corresponding to the first frequency range, the second cascode amplifier coupled between the main amplifier and the second output and corresponding to the second frequency range.

19. The apparatus of claim 18, wherein the wireless interface device further comprises:
a first balun coupled to the first output and corresponding to the first frequency range; and
a second balun coupled to the second output and corresponding to the second frequency range.

20. The apparatus of claim 19, wherein:
the upconverter corresponds to the first frequency range, the second frequency range, and a third frequency range;
the main amplifier corresponds to the first frequency range, the second frequency range, and the third frequency range;
the second cascode amplifier corresponds to the second frequency range and the third frequency range; and
the tunable filter is configured to selectively correspond to:
the first frequency range for a first mode; and
the second frequency range and the third frequency range for a second mode.

21. A method for processing signals for wireless transmission, the method comprising:
upconverting, using an upconverter, a first signal at a baseband frequency to a radio frequency to produce a first upconverted signal, the first upconverted signal corresponding to a first frequency range;
filtering, using a tunable filter, the first upconverted signal to produce a first filtered signal,
the tunable filter comprising an adjustable inductor and a capacitor that are coupled together in parallel,
the adjustable inductor comprising multiple inductors including a first inductor and a second inductor and a switch coupled to at least one of the multiple inductors, the second inductor coupled in series with the switch to form a series connection between an input and an output of the tunable filter, the first inductor coupled between the input and the output of the tunable filter and in parallel with the series connection of the second inductor and the switch, and
the tunable filter further comprising an adjustable capacitor having a first terminal and a second terminal, the first terminal coupled between the second inductor and the switch, the second terminal coupled to a ground node;
amplifying, using a driver amplifier, the first filtered signal to produce a first amplified signal;
upconverting, using the upconverter, a second signal at a baseband frequency to another radio frequency to produce a second upconverted signal, the second upconverted signal corresponding to a second frequency range;
filtering, using the tunable filter, the second upconverted signal to produce a second filtered signal; and
amplifying, using the driver amplifier, the second filtered signal to produce a second amplified signal.

22. The method of claim 21, wherein:
the filtering of the first upconverted signal to produce the first filtered signal comprises:
opening the switch of the adjustable inductor of the tunable filter; and
routing the first upconverted signal through at least the first inductor of the adjustable inductor of the tunable filter to produce the first filtered signal; and
the filtering of the second upconverted signal to produce the second filtered signal comprises:
closing the switch of the adjustable inductor of the tunable filter; and
responsive to the closing, routing the second upconverted signal through at least the second inductor of the adjustable inductor of the tunable filter to produce the second filtered signal.

23. An apparatus for processing signals for wireless transmission, the apparatus comprising:
a wireless interface device comprising:
an upconverter having a load circuit portion comprising an adjustable inductor in parallel with a capacitor; and
a driver amplifier coupled to the upconverter, the driver amplifier comprising:
a multiband section comprising a main amplifier, the main amplifier coupled to an input of the driver amplifier; and
a split-band section comprising a first cascode amplifier and a second cascode amplifier, the first cascode amplifier coupled between the main amplifier and a first output of the driver amplifier, the second cascode amplifier coupled between the main amplifier and a second output of the driver amplifier.

24. The apparatus of claim 23, wherein:
the driver amplifier is configured to amplify signals corresponding to a first frequency range and a second frequency range;
the main amplifier is configured to amplify signals corresponding to the first frequency range and the second frequency range;
the first cascode amplifier is configured to amplify signals corresponding to the first frequency range; and
the second cascode amplifier is configured to amplify signals corresponding to the second frequency range.

25. The apparatus of claim 24, wherein the adjustable inductor comprises:
a switch;
a first inductor coupled in parallel with the capacitor; and
a second inductor coupled in series with the switch and in parallel with the capacitor.

26. An apparatus for processing signals for wireless transmission, the apparatus comprising:
a wireless interface device comprising:
an upconverter having an output, the upconverter configured to upconvert a baseband frequency to a radio frequency based on a local oscillator signal;
a tunable filter having an input and an output, the input of the tunable filter coupled to the output of the upconverter, the tunable filter comprising:
a plus inductive-capacitive (LC) tank; and
a minus LC tank;
a driver amplifier having an input, the input of the driver amplifier coupled to the output of the tunable filter; and
an inductor shunted across the plus LC tank and the minus LC tank, the inductor coupled between the output of the tunable filter and the input of the driver amplifier.

27. The apparatus of claim 26, wherein the inductor is switchably coupled:
between the output of the tunable filter and the input of the driver amplifier; and
between the output of the upconverter and the input of the tunable filter.

28. An apparatus for processing signals for wireless transmission, the apparatus comprising:
a wireless interface device comprising:
an upconverter having an output, the upconverter configured to upconvert a baseband frequency to a radio frequency based on a local oscillator signal;
a tunable filter having an input and an output, the input of the tunable filter coupled to the output of the upconverter; and
a driver amplifier having an input, the input of the driver amplifier coupled to the output of the tunable filter, the driver amplifier comprising:
a first output and a second output, the first output corresponding to a first frequency range and the second output corresponding to a second frequency range, the input of the driver amplifier corresponding to the first frequency range and the second frequency range;
a main amplifier coupled to the input of the driver amplifier, the main amplifier corresponding to the first frequency range and the second frequency range; and
multiple cascode amplifiers comprising a first cascode amplifier and a second cascode amplifier, the first cascode amplifier coupled between the main amplifier and the first output and corresponding to the first frequency range, the second cascode amplifier coupled between the main amplifier and the second output and corresponding to the second frequency range.

29. The apparatus of claim 28, wherein the wireless interface device further comprises:
a first balun coupled to the first output and corresponding to the first frequency range; and
a second balun coupled to the second output and corresponding to the second frequency range.

30. The apparatus of claim 29, wherein:
the upconverter corresponds to the first frequency range, the second frequency range, and a third frequency range;
the main amplifier corresponds to the first frequency range, the second frequency range, and the third frequency range;
the second cascode amplifier corresponds to the second frequency range and the third frequency range; and
the tunable filter is configured to selectively correspond to:
the first frequency range for a first mode; and
the second frequency range and the third frequency range for a second mode.

* * * * *